United States Patent
Konno

(10) Patent No.: US 8,212,268 B2
(45) Date of Patent: *Jul. 3, 2012

(54) EPITAXIAL WAFER, LIGHT-EMITTING ELEMENT, METHOD OF FABRICATING EPITAXIAL WAFER AND METHOD OF FABRICATING LIGHT-EMITTING ELEMENT

(75) Inventor: Taichiroo Konno, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 98 days.

This patent is subject to a terminal disclaimer.

(21) Appl. No.: 12/692,754

(22) Filed: Jan. 25, 2010

(65) Prior Publication Data

US 2011/0057214 A1  Mar. 10, 2011

(30) Foreign Application Priority Data

Sep. 4, 2009  (JP) .................................. 2009-204289

(51) Int. Cl.
*H01L 33/00* (2010.01)
(52) U.S. Cl. .................... 257/95; 257/97; 257/E33.069; 438/38
(58) Field of Classification Search .................... 257/94, 257/95, E33.069, 97; 438/38
See application file for complete search history.

(56) References Cited

U.S. PATENT DOCUMENTS

| 5,226,053 | A * | 7/1993 | Cho et al. ................... 372/45.01 |
| 5,260,589 | A | 11/1993 | Yamauchi et al. | |
| 2008/0083919 | A1 * | 4/2008 | Takahashi et al. ............. 257/13 |
| 2010/0084670 | A1 * | 4/2010 | Cheng et al. .................. 257/98 |

FOREIGN PATENT DOCUMENTS

JP  5-37017 A  2/1993

* cited by examiner

*Primary Examiner* — Howard Weiss
*Assistant Examiner* — John C Ingham
(74) *Attorney, Agent, or Firm* — Foley & Lardner LLP

(57) ABSTRACT

An epitaxial wafer, a light-emitting element, a method of fabricating the epitaxial wafer and a method of fabricating the light-emitting element, which have a high output and a low forward voltage, and can be fabricated without increasing fabricating cost, are provided. The epitaxial wafer is formed with a light-emitting portion, a reflective portion provided between a semiconductor substrate and the light-emitting portion and a current dispersing layer having first and second current dispersing layers, wherein the reflective portion has plural pairs of layers having first and second semiconductor layers wherein the first semiconductor layer has a thickness of $T_A$ defined by Equation (1), $$T_A = \frac{\lambda_p}{4 n_A \sqrt{1 - \left(\frac{n_{In}\sin\theta}{n_A}\right)^2}} \quad (1)$$

the second semiconductor layer has a thickness of $T_B$ defined by Equation (2), $$T_B = \frac{\lambda_p}{4 n_B \sqrt{1 - \left(\frac{n_{In}\sin\theta}{n_B}\right)^2}} \quad (2)$$

and the second current dispersing layer has a high carrier density or a high impurity density and is provided with the convexoconcave portion on the surface.

11 Claims, 15 Drawing Sheets

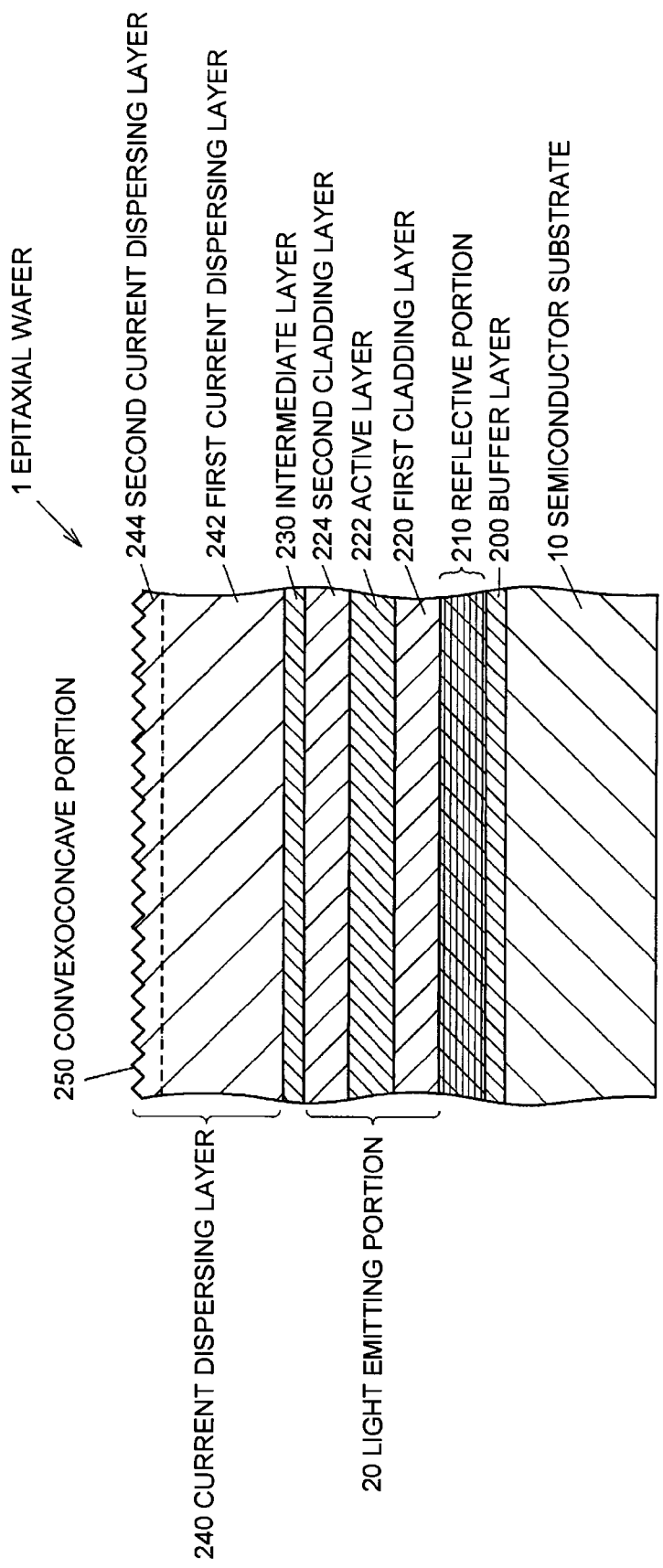

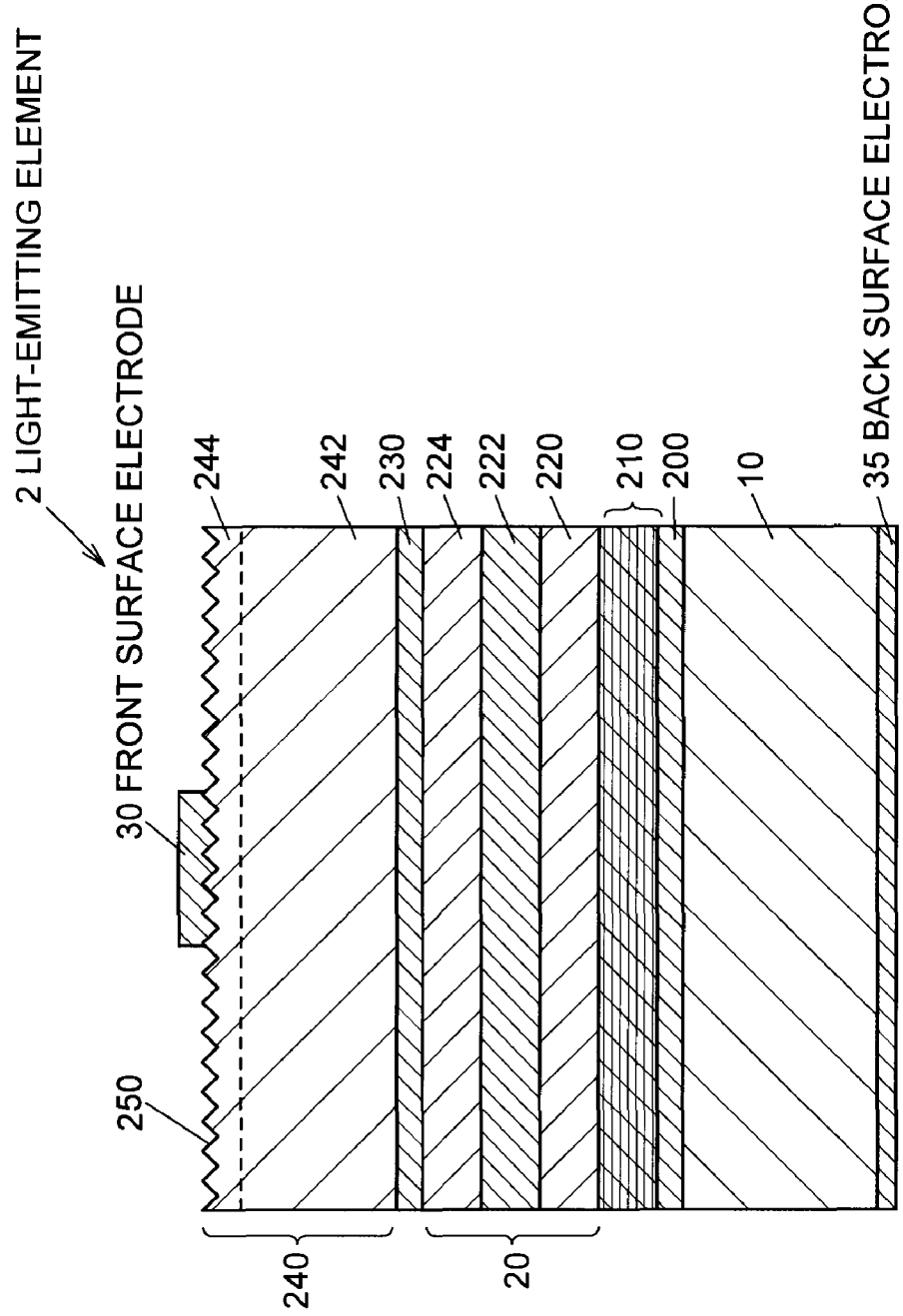

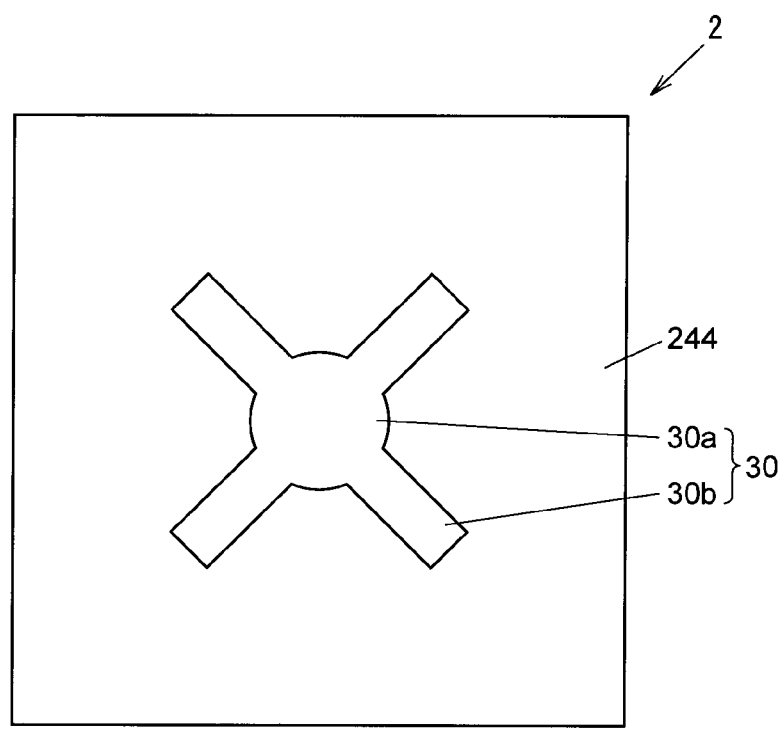

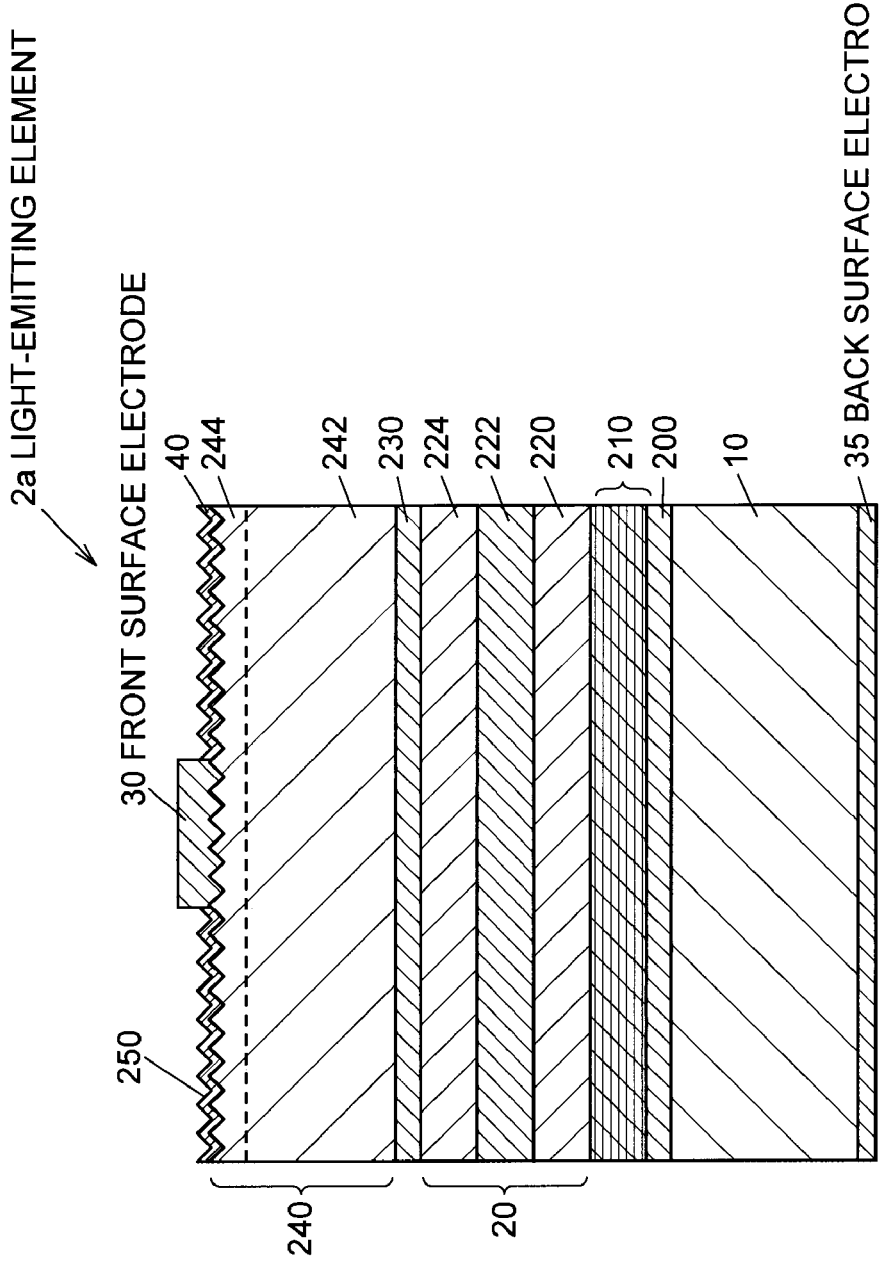

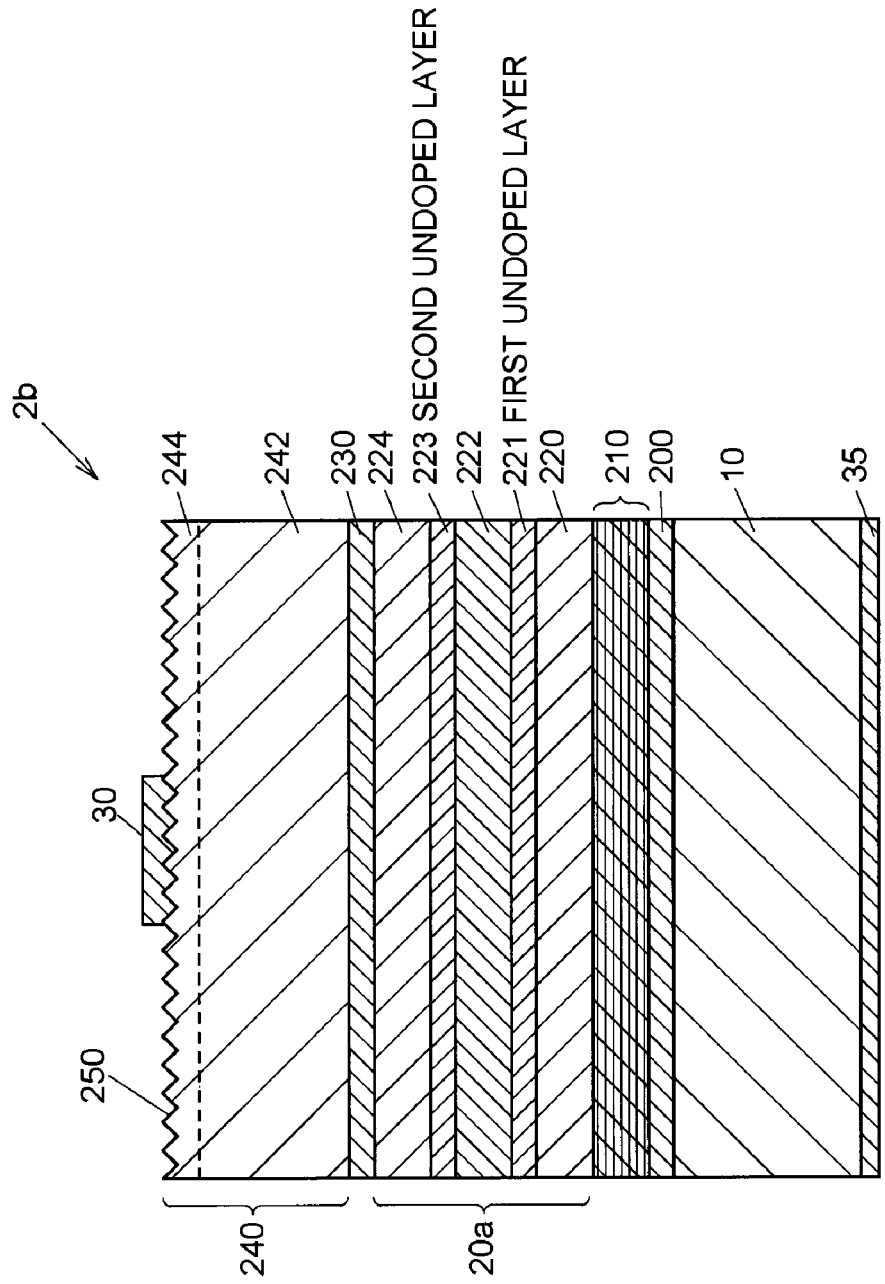

EPITAXIAL WAFER, LIGHT-EMITTING ELEMENT, METHOD OF FABRICATING EPITAXIAL WAFER AND METHOD OF FABRICATING LIGHT-EMITTING ELEMENT

The present application is based on Japanese Patent Application No. 2009-204289 filed on Sep. 4, 2009, the entire contents of which are incorporated herein by reference.

BACKGROUND OF THE INVENTION

1. Field of the Invention

The present invention relates to an epitaxial wafer, a light-emitting element, a method of fabricating the epitaxial wafer and a method of fabricating the light-emitting element. Especially, the present invention relates to an epitaxial wafer and a light-emitting element comprising a convexoconcave portion (an irregularity portion) on a light-extracting surface and a reflective layer comprising plural semiconductor layers, a method of fabricating the epitaxial wafer and a method of fabricating the light-emitting element.

2. Related Art

A conventional light-emitting element comprising an n-type GaAs substrate, an optical reflective layer on the n-type GaAs substrate, an n-type $Al_{0.45}Ga_{0.55}As$ cladding layer on the optical reflective layer, a p-type GaAs active layer on the n-type $Al_{0.45}Ga_{0.55}As$ cladding layer, a p-type $Al_{0.45}Ga_{0.55}As$ cladding layer on the p-type GaAs active layer and a p-type GaAs cap layer on the p-type $Al_{0.45}Ga_{0.55}As$ cladding layer is known, wherein the optical reflective layer comprises a layered structure of n-type AlAs/ n-type $Al_xGa_{1-x}As$ which is formed as a chirped structure, in which each thickness of each layer is varied continuously, and relations among a thickness-varying ratio, the number of layers and a crystal-mixing ratio are regulated to obtain a predetermined reflective wavelength width and a predetermined reflectivity (see e.g. JP-A 5-37017).

In the light-emitting element described in JP-A 5-37017, it is possible to improve the output of light because the optical reflective layer reflects the light propagated to the substrate by interference effect of light waves.

In the light-emitting element described in JP-A 5-37017, however, it is difficult to improve the light-emitting output without thickening the optical reflective layer, though it is possible to widen a wavelength width of the reflected light in the optical reflective layer itself. Further, there is a case that a film thickness of the optical reflective layer is required to be increased in order to improve the light-emitting output of the light-emitting element. In such a case, there is a concern that a fabricating cost largely rises up because of the increases of raw materials and the growth time according to the increase of the number of the total layers to be grown up. Furthermore, there is a case that it is impossible to improve largely the light-emitting out even in the light-emitting element comprising both the conventional optical reflective layer and the convexoconcave portion on the surface of the element. Still further, there is a case that a forward voltage is sometimes higher than a value suitable for practical use of the light-emitting element, when the light-emitting element is fabricated from an epitaxial wafer comprising convexoconcave portion on the surface of the element.

SUMMARY OF THE INVENTION

Accordingly, it is an object of the present invention to provide an epitaxial wafer, a light-emitting element, a method of fabricating the epitaxial wafer and a method of fabricating the light-emitting element which can achieve a high output and a low forward voltage without a large increase of the fabricating cost.

(1) According to a feature of the invention, an epitaxial wafer comprises:
a semiconductor substrate;
a light-emitting portion including an active layer provided between a first cladding layer of a first conductivity type and a second cladding layer of a second conductivity type different from the first conductivity type;
a reflective portion which is provided between the semiconductor substrate and the light-emitting portion and which reflects a light emitted from the active layer; and
a current dispersing layer provided on an opposite side of the reflective portion in relation to the light-emitting portion, and including first and second current dispersing layers having different carrier densities and impurity densities from each other,
in which the reflective portion includes plural pairs of layers each including a semiconductor layer and a second semiconductor layer different from the first semiconductor layer,
in which the first semiconductor layer has a thickness of $T_A$ defined by Equation (1), $$T_A = \frac{\lambda_p}{4n_A\sqrt{1-\left(\frac{n_{In}\sin\theta}{n_A}\right)^2}} \quad (1)$$

in which $\lambda_p$ is an wavelength at a peak of the light emitted from the active layer, $n_A$ is a refractive index of the first semiconductor layer, $n_B$ is a refractive index of the second semiconductor layer, $n_{In}$ is a refractive index of the first cladding layer and $\theta$ is an incident angle to the second semiconductor layer,
in which the second semiconductor layer has a thickness of $T_B$ defined by Equation (2), $$T_B = \frac{\lambda_p}{4n_B\sqrt{1-\left(\frac{n_{In}\sin\theta}{n_B}\right)^2}} \quad (2)$$

in which the second current dispersing layer has a higher carrier density than the first current dispersing layer or has a higher impurity density than the first current dispersing layer, and the second current dispersing layer is provided with a convexoconcave portion on the surface.

(2) In the epitaxial wafer, the reflective portion may comprise at least three pairs of layers,
in which a thickness of each pair of layers is different from each other according to differences of $\theta$ in Equations (1) and (2) for each pair of layers,
in which at least one pair of layers includes first and second semiconductor layers which are defined by a value of $\theta$ larger than 50°.

(3) The epitaxial wafer may further comprise:
an intermediate layer provided between the second cladding layer and the current dispersing layer,
in which the intermediate layer is formed from a semiconductor having a bandgap energy between that of a semiconductor composing the second cladding layer and that of a semiconductor composing the current dispersing layer.

(4) In the epitaxial wafer, it is preferable that the first and second semiconductor layers are transparent to a light emitted from the active layer, and comprising an AlGaAs based semiconductor which has a larger bandgap energy than that of a semiconductor composing the active layer, in which an Al composition of the semiconductor layer composing the first semiconductor layer is different from that of the second semiconductor composing the second semiconductor layer.

(5) In the epitaxial wafer, it is preferable that one of the first and second semiconductor layers of a pair of layers positioned firstly in the reflective portion relative to the semiconductor substrate or one of the first and second semiconductor layers of pairs of layers positioned firstly and secondly therein relative to the semiconductor substrate are formed from a semiconductor material which is opaque to the light emitted from the active layer, or are formed from a semiconductor material having a smaller bandgap energy than that of the active layer.

(6) According to one embodiment of the epitaxial wafer, the intermediate layer includes $Ga_zIn_{1-z}P(0.6 \leq z \leq 0.9)$.

(7) According to another feature of the invention, a light-emitting element comprises:

the epitaxial wafer according to the feature (1);

a front surface electrode provided on the second current dispersing layer; and a back surface electrode provided on an opposite side of the reflective portion in relation to the semiconductor substrate.

(8) The light-emitting element may further comprise:

a light-extracting layer on a surface of the second current dispersing layer in a region excluding the front surface electrode, in which a material composing the light-extracting layer is transparent to a light emitted from the active layer and has a refractive index between that of semiconductor composing the second current dispersing layer and that of air.

(9) In the light-emitting element, it is preferable that the light-extracting layer has a thickness of d within ±30% of a value defined by $A \times \lambda_p/(4 \times n)$, in which $\lambda_p$, is an wavelength of a light emitted from the active layer, n is a refractive index of the light-extracting layer and A is a constant (A is an odd number).

(10) According to a still another feature of the invention, a method of fabricating an epitaxial wafer comprises:

growing a reflective portion, formed on a semiconductor substrate, including plural pairs of layers having a first semiconductor layer and a second semiconductor layer different from the first semiconductor layer;

growing a light-emitting portion, formed on the reflective portion, including an active layer provided between a first cladding layer of a first conductivity type and a second cladding layer of a second conductivity type which is different from the first conductivity type;

growing a current dispersion layer, formed on the light-emitting portion, including first and second current dispersing layers which have different carrier densities or impurity densities each other; and forming a convexoconcave portion on a surface of the second current dispersing layer, in which the first semiconductor layer has a thickness of $T_A$ defined by Equation (1), $$T_A = \frac{\lambda_p}{4n_A \sqrt{1 - \left(\frac{n_{In}\sin\theta}{n_A}\right)^2}} \quad (1)$$

in which $\lambda_p$, is a peak wavelength of a light emitted from the active layer, $n_A$ is a refractive index of the first semiconductor layer, $n_B$ is a refractive index of the second semiconductor layer, $n_{In}$ is a refractive index of the first cladding layer and θ is an incident angle of a light to the second semiconductor layer;

in which the second semiconductor layer has a thickness of $T_B$ defined by Equation (2), $$T_B = \frac{\lambda_p}{4n_B \sqrt{1 - \left(\frac{n_{In}\sin\theta}{n_B}\right)^2}} \quad (2)$$

in which the second current dispersing layer has a higher carrier density than that of the first semiconductor layer or a higher impurity density than that of the first semiconductor layer and is provided with the convexoconcave portion on the surface.

(11) According to a further feature of the invention, a method of fabricating a light-emitting element comprises:

growing a reflective portion comprising plural pair of layers, formed on a semiconductor substrate, including a first semiconductor layer and a second semiconductor layer different from the first semiconductor layer;

growing a light-emitting portion, formed on the reflective portion, including an active layer provided between a first cladding layer of a first conductivity type and a second cladding layer of a second conductivity type which is different from the first conductivity type;

growing a current dispersion layer, formed on the light-emitting portion, including a first and second current dispersing layers which have different carrier densities or impurity densities each other;

forming a convexoconcave portion on a surface of the second current dispersing layer;

forming plural front surface electrodes on a surface of the second current dispersing layer after the forming step of the convexoconcave portion, and cutting each region among the plural front surface electrodes, in which the first semiconductor layer has a thickness of $T_A$ defined by Equation (1), $$T_A = \frac{\lambda_p}{4n_A \sqrt{1 - \left(\frac{n_{In}\sin\theta}{n_A}\right)^2}} \quad (1)$$

in which λp is a peak wavelength of a light emitted from the active layer, $n_A$ is a refractive index of the first semiconductor layer, $n_B$ is a refractive index of the second semiconductor layer, $n_{In}$, is a refractive index of the first cladding layer and θ is an incident angle of a light to the second semiconductor layer, in which the second semiconductor layer has a thickness of $T_B$ defined by Equation (2), $$T_B = \frac{\lambda_p}{4n_B \sqrt{1 - \left(\frac{n_{In}\sin\theta}{n_B}\right)^2}} \quad (2)$$

in which the second current dispersing layer has a higher carrier density than that of the first semiconductor layer or higher impurity density than that of the first semiconductor layer and is provided with the convexoconcave portion on the surface.

Advantages of Invention

An epitaxial wafer, a light-emitting element, a method of fabricating the epitaxial wafer, and a method of fabricating the light-emitting element according to this invention can provide an epitaxial wafer and a light-emitting element with a high output and a low forward voltage, and methods of fabricating the epitaxial wafer and the light-emitting element without largely increasing the fabricating cost.

BRIEF DESCRIPTION OF THE DRAWINGS

Next, the present invention will be explained in more detail in conjunction with appended drawings, wherein:

FIG. 1A is a schematic partial cross section of an epitaxial wafer in a first embodiment of the invention;

FIG. 2A is a schematic cross section of a light-emitting element in a second embodiment of the invention;

FIG. 2B is a schematic plan view of a light-emitting element in the second embodiment of the invention;

FIG. 3 is a schematic cross section of a light-emitting element in a third embodiment of the invention;

FIG. 4 is a schematic cross section of a light-emitting element in a fourth embodiment of the invention;

DESCRIPTION OF THE PREFERRED EMBODIMENTS

Summary of Embodiments

Figure 1B:
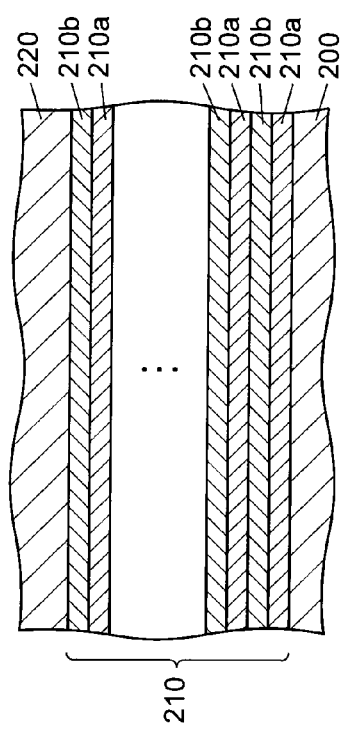
FIG. 1B is a schematic cross section of a reflective portion which is provided in the epitaxial wafer in the first embodiment of the invention.

An epitaxial wafer comprises a semiconductor substrate, a light-emitting portion including an active layer provided between a first cladding layer of a first conductivity type and a second cladding layer of a second conductivity type different from the first conductivity type, a reflective portion, which reflects a light emitted from the active layer, provided between the semiconductor substrate and the light-emitting portion, and a current dispersing layer including a first and second current dispersing layers which have different carrier densities and impurity densities each other, wherein the reflective portion includes plural pairs of a first semiconductor layer and a second semiconductor layer which is different from the first semiconductor layer, wherein the first semiconductor layer has a thickness of $T_A$ defined by Equation (1), $$T_A = \frac{\lambda_p}{4n_A\sqrt{1-\left(\frac{n_{In}\sin\theta}{n_A}\right)^2}} \quad (1)$$

wherein $\lambda_p$ is an wavelength of the light emitted from the active layer, $n_A$ is a refractive index of the first semiconductor layer, $n_B$ is a refractive index of a second semiconductor layer, $n_{In}$ is a refractive index of the first cladding layer, $\theta$ is an incident angle of the light to the first semiconductor layer, wherein the second semiconductor layer has a thickness of $T_B$ defined by Equation (2), $$T_B = \frac{\lambda_p}{4n_B\sqrt{1-\left(\frac{n_{In}\sin\theta}{n_B}\right)^2}} \quad (2)$$

wherein the second current dispersing layer has a higher carrier density or a higher impurity density than that of the first current dispersing layer and is provided with a convexoconcave portion on the surface.

Furthermore, a light-emitting element comprising a semiconductor substrate, a light-emitting portion which has an active layer provided between a first cladding layer of a first conductivity type and a second cladding layer of a second conductivity type and a reflective portion which reflects a light from the active layer, includes a current dispersing layer having a first and second current dispersing layers which have different carrier densities and different impurity densities each other, a front surface electrode on the second current dispersing layer and a back surface electrode on an opposite side of the reflective layer in relation to the semiconductor substrate, wherein the reflective portion has plural pairs of layers comprising a first semiconductor layer and a second semiconductor layer which is different from the first semiconductor layer, wherein the first semiconductor layer has a thickness of $T_A$ defined by Equation (1), $$T_A = \frac{\lambda_p}{4n_A\sqrt{1-\left(\frac{n_{In}\sin\theta}{n_A}\right)^2}} \quad (1)$$

wherein $\lambda_p$ is a wavelength of the light emitted from the active layer, $n_A$ is a refractive index of the first semiconductor layer, $n_B$ is a refractive index of the second semiconductor layer, $n_{In}$ is a refractive index of the first cladding layer, $\theta$ is an incident angle to the first semiconductor layer, wherein the second semiconductor layer has a thickness of $T_B$ defined by Equation (2), $$T_B = \frac{\lambda_p}{4n_B\sqrt{1-\left(\frac{n_{In}\sin\theta}{n_B}\right)^2}} \quad (2)$$

wherein the second current dispersing layer has a higher carrier density or a higher impurity density than that of the first current dispersing layer and is provided with a convexoconcave portion on the surface.

Furthermore, a method of fabricating an epitaxial wafer which fabricates an epitaxial wafer for a light-emitting element by epitaxially growing plural semiconductor layers on a semiconductor substrate comprises steps of growing a reflective portion which has a first and second semiconductor layers different from each other, a light-emitting portion which has an active layer provided between a first cladding layer of a first conductivity type and a second cladding layer of a second conductivity type, a current dispersing portion including a first and second current dispersing layers which have different carrier densities or different impurity densities each other and a convexoconcave portion on the surface of the second current dispersing layer, wherein the first semiconductor layer has a thickness of $T_A$ defined by Equation (1), $$T_A = \frac{\lambda_p}{4n_A\sqrt{1-\left(\frac{n_{In}\sin\theta}{n_A}\right)^2}} \quad (1)$$

wherein $\lambda_p$ is the wavelength of a light emitted from the active layer, $n_A$ is a refractive index of the first semiconductor layer, $n_B$ is a refractive index of the second semiconductor layer, $n_{In}$ is a refractive index of the first cladding layer, $\theta$ is an incident angle to the first semiconductor layer, wherein the second semiconductor layer has a thickness of $T_B$ defined by Equation (2), $$T_B = \frac{\lambda_p}{4n_B\sqrt{1-\left(\frac{n_{In}\sin\theta}{n_B}\right)^2}} \quad (2)$$

wherein the second current dispersing layer has a higher carrier density than that of the first current dispersing layer or a higher impurity density than that of the first current dispersing layer and is provided with a convexoconcave portion on the surface.

Furthermore, a method of fabricating a light-emitting element by cutting an epitaxial wafer after fabricating an epitaxial wafer for a light-emitting element by epitaxially growing plural semiconductor layers on a semiconductor substrate comprises the steps of growing a reflective portion which has a first semiconductor layer and a second semiconductor layer different from the first semiconductor layer, a light-emitting portion which has an active layer provided between a first cladding layer of a first conductivity type and a second cladding layer of a second conductivity type, a current dispersing portion including a first and second current dispersing layers which have different carrier densities or different impurity densities each other, a convexoconcave portion on the surface of the second current dispersing layer, plural front surface electrodes on the surface of the second current dispersing layer after forming the convexoconcave portion, and cutting each region among the plural front surface electrodes, wherein the first semiconductor layer has a thickness of $T_A$ defined by Equation (1), $$T_A = \frac{\lambda_p}{4n_A\sqrt{1-\left(\frac{n_{In}\sin\theta}{n_A}\right)^2}} \quad (1)$$

wherein $\lambda_p$ is a wavelength of a light emitted from the active layer, $n_A$ is a refractive index of the first semiconductor layer, $n_B$ is a refractive index of the second semiconductor layer, $n_{In}$ is a refractive index of the first cladding layer, $\theta$ is an incident angle to the first semiconductor layer, wherein the second semiconductor layer has a thickness of $T_B$ defined by Equation (2), $$T_B = \frac{\lambda_p}{4n_B\sqrt{1-\left(\frac{n_{In}\sin\theta}{n_B}\right)^2}} \quad (2)$$

wherein the second current dispersing layer has a higher carrier density than that of the first current dispersing layer or a higher impurity density than that of the first current dispersing layer and is provided with the convexoconcave portion on the surface.

(First Embodiment)

FIG. 1A shows a schematic partial cross section of an epitaxial wafer of a first embodiment of the invention and FIG. 1B shows a schematic cross section of a reflective portion composing the epitaxial wafer of the first embodiment of the invention.

(Structural Overview of Epitaxial Wafer 1)

The epitaxial wafer 1 of the first embodiment is, for example, for a light-emitting diode (hereinafter LED) as a semiconductor light-emitting element for emitting red light. The epitaxial wafer 1 concretely comprises an n-type semiconductor substrate 10 of a first conductivity type, an n-type buffer layer 200 provided on the semiconductor substrate 10, a reflective portion 210 including a multi-layers of n-type compound semiconductor provided on the buffer layer 200, an n-type first cladding layer 220 provided on the reflective portion 210, an active layer 222 provided on the first cladding layer 220, a p-type second cladding layer 224 of a second conductivity type different from the first conductivity type on the active layer 222, a p-type intermediate layer 230 on the second cladding layer 224 and a current dispersing layer having a first current dispersing layer 242 and a second current dispersing layer 244 which have different carrier densities or impurity densities each other.

In this embodiment, the second current dispersing layer 244 is provided on a distant side from the semiconductor substrate 10 than the first current dispersing layer 242 and is provided with a convexoconcave portion 250 on the surface (i.e. light-extracting surface). In other words, the second current dispersing layer 244 is provided as a top layer of the current dispersing layer 240. Furthermore, in this embodiment, the active layer 222 is provided between the first cladding layer 220 and the second cladding layer 224, so that, in explanation in detail is omitted except for the differences below, there are some cases where the first cladding layer 220, the active layer 222 and the second cladding layer 224 are called collectively as "light-emitting portion 20".

(Semiconductor Substrate 10)

A GaAs substrate comprising carriers of a suitable conductivity type and a suitable carrier density may be used as a semiconductor substrate 10. Furthermore, off-substrate having a suitable off-angle or a just-substrate with no off-angle may be used for the semiconductor substrate 10. Still more, a compound semiconductor material for composing the semiconductor substrate 10 may be changed depending on kinds of plural compound semiconductor layers grown on the semiconductor substrate 10.

(Reflective Portion 210)

The reflective portion 210 is provided between the semiconductor substrate 10 and light-emitting portion 20, and reflects light emitted from the active layer 222. The reflective portion 210 is concretely formed as a layered structure of plural compound semiconductor layers. Furthermore, the reflective portion 210 comprises plural pairs of layers including the a first semiconductor layer 210a and a second semiconductor layer 210b, in which a refractive index is different from that of the first semiconductor layer 210a. The first semiconductor layer 210a and the second semiconductor layer 210b are transparent for the light emitted from the active layer 222 and are formed from an AlGaAs based semiconductor (e.g. $Al_xGa_{1-x}As$ ($0 \leq x \leq 1$)). Furthermore, the first semiconductor layer 210a and the second semiconductor layer 210b are formed so as to have different composition of Al each other.

Furthermore, the reflective portion 210 is formed to have three pairs of layers at least. Furthermore, for example, the first semiconductor layer 210a may be formed from $Al_xGa_{1-x}As$ ($0 \leq x \leq 1$) and the second semiconductor layer 210b may be formed from $Al_yGa_{1-y}As$ ($0 \leq y \leq 1$). Furthermore, the first and second semiconductor layers should be formed so as to have different refractive index each other. When the first semiconductor layer 210a is formed from AlGaAs, the Al composition x of the first semiconductor layer 210a is controlled to have a different composition from the Al composition y of the second semiconductor layer 210b. Furthermore, a thickness of the first semiconductor layer 210a and a thickness of the second semiconductor layer 210b may be formed to be dependent on an incident angle of light, but those are shown as the same thickness in FIG. 1B for convenience of explanation in detail is omitted except for the difference.

Herein, each pair of plural pairs of layers in the reflective portion reflects light of wavelength larger than a peak wavelength of a light emitted from the active layer 222 and reflects light with different incident angles. The first semiconductor layer 210a is concretely formed to have a thickness of $T_A$ defined by Equation (1), $$T_A = \frac{\lambda_p}{4n_A\sqrt{1 - \left(\frac{n_{In}\sin\theta}{n_A}\right)^2}} \quad (1)$$

wherein $\lambda_p$ is the wavelength of the light emitted from the active layer, $n_A$ is a refractive index of the first semiconductor layer 210a, $n_B$ is a refractive index of the second semiconductor layer 210b, $n_{In}$ is a refractive index of the first cladding layer 220, θ is an incident angle to the second semiconductor layer 210b (when the incident plane is assumed to the principal plane of the second semiconductor layer 210b, θ is an angle for the normal line of the incident plane). Furthermore, the second semiconductor layer 210b is formed to have a thickness of $T_B$ defined by Equation (2), $$T_B = \frac{\lambda_p}{4n_B\sqrt{1 - \left(\frac{n_{In}\sin\theta}{n_B}\right)^2}} \quad (2)$$

The first semiconductor layer 210a included in a pair of layers is formed to have a thickness calculated from the Equation (1) dependent of the incidence angle θ of the light which enters into the pair of layers. As the same, the second semiconductor layer 210b included in a pair of layers is formed to have a thickness calculated from the Equation (2) dependent on the incidence angle θ. As the same, the other pair of layers are formed to include the first semiconductor layer 210a and the second semiconductor layer 210b which have thickness dependent on the incident angle of the light which enters into those pairs of layers.

Herein, the reflective portion 210 of this embodiment is formed to have three pairs of layers at least. Further, the plural pairs of layers are formed to have a thickness different from each other, because θ of Equations (1) and (2) of each pair of layers is different from each other. For example, the thickness of one pair of layers is different from those of the other pair's. When θ is $\theta_a$ for one pair of layers and when θ is $\theta_b$ for other pair of layers, a thickness of a first semiconductor layer 210a and a thickness of a second semiconductor layer 210b which are included in the one pair of layers are calculated by the Equations (1) and (2) using $\theta_a$, and thickness of a first semiconductor layer 210a and a second semiconductor layer 210b included in the other pair of layers are calculated by Equations (1) and (2) using $\theta_b$ different from $\theta_a$. Furthermore, the light except a direct incident light which enters into the reflective portion 210 from the light-emitting portion 20 can be reflected to a side of the light-extracting surface, because one pair of layers at least is formed so as to include the first semiconductor layer 210a and the second semiconductor layer 210b having thickness defined when θ is larger than 50. Though the light emitted from the active layer 222 enters into the reflective portion 210 with various incident angles, a light-emitting element in which the light is reflected to a direction of the light-extracting surface from the reflective portion 210 can be provided, because the epitaxial wafer 1 of this embodiment comprises such reflective portion 210.

Furthermore, it is preferable that one of the first semiconductor layer 210a and the second semiconductor layer 210b for composing a pair firstly positioned in the reflective portion 210 from the semiconductor substrate 10, or one of the first semiconductor layers 210a and the second semiconductor layers 210b of both the firstly positioned pair and a secondly positioned pair in the reflective portion 210 from the semiconductor substrate 10 is formed from a semiconductor material which is opaque to the light emitted from the active layer 222 or which has a smaller bandgap energy than that of the active layer 222.

(Buffer Layer 200 and Light-Emitting Portion 20)

The light-emitting portion 20 comprises the first cladding layer 220, an active layer 222 and the second cladding layer 224. At first, the buffer layer 200 is provided to be adjacent to the semiconductor substrate 10 and is formed from a compound semiconductor material which has carriers of a predetermined conductive type carrier and has a predetermined carrier density. For example, when the semiconductor substrate is formed from an n-type GaAs substrate, the buffer layer is formed from the n-type GaAs. Furthermore, the first cladding layer 220, the active layer 222 and the second cladding layer 224 are formed from a ternary compound based or a quaternary compound based of compound semiconductor material in group III represented by e.g. $(Al_xGa_{1-x})_yIn_{1-y}P$ ($0 \leq x \leq 1$, $0 \leq y \leq 1$). Herein, the active layer 222 of the first embodiment may be formed from for example a single layer of $Ga_xIn_{1-x}P$ ($0 \leq x \leq 1$) with no doping.

(Intermediate Layer 230)

The intermediate layer 230 is, when a semiconductor material of a second cladding layer 224 and a semiconductor material of a current dispersing layer 240 are different from each other, formed from a semiconductor material which lowers electrical potential barrier of hetero-interface between the second cladding layer and the current dispersing layer. Concretely, the intermediate layer 230 is provided between the second cladding layer 224 and the current dispersing layer 240 (more correctly, the first current dispersing layer 242). More concretely, the intermediate layer 230 is provided on the opposite side of the active layer 222 in relation to the second cladding layer 224, and is formed from a semiconductor material which has a bandgap energy between that of the semiconductor forming the second cladding layer 230 and that of the semiconductor forming the current dispersing layer 240 (i.e. the first current dispersing layer 242 and the second current dispersing layer 244). For example, the intermediate layer 230 formed from a p-type $Ga_zIn_{1-z}P$ (for an example, $0.6 \leq z \leq 0.9$). A forward voltage of the light-emitting element fabricated from the epitaxial wafer 1 can be lowered by providing the intermediate layer 230 in the epitaxial wafer 1.

(Current Dispersing Layer 240)

The current dispersing layer 240 is provided on the opposite side of the reflective portion 210 in relation to the light-emitting portion 20 and disperses current so as to supply substantially uniformly current to the active layer 222 when current is supplied to the light-emitting element formed from the epitaxial wafer 1. Furthermore, the current dispersing layer 240 is formed from a material which is transparent to the light emitted from the active layer 222. For example, the current dispersing layer 240 may be formed from p-type GaP, p-type GaAsP, or p-type AlGaAs. Furthermore, the current dispersing layer 240 of this embodiment comprises the first current dispersing layer 242 and the second current dispersing layer 244 in this order from the semiconductor substrate 10.

In this embodiment, the second current dispersing layer 244 is formed to have a higher carrier density than that of the first current dispersing layer 242 or an impurity density than that of the first current dispersing layer 242. More concretely, the second current dispersing layer 244 has a highest carrier density or a highest impurity density in the current dispersing layer 240 and is formed at the principal plane (surface) of the epitaxial wafer 1. Furthermore, the second current dispersing layer 244 is provided with a convexoconcave portion 250 on the surface.

In addition, it is preferable that the current dispersing layer 240 is formed to have a thickness which is not less than 2.0 μm and not more than 10.0 μm. Further, it is preferable that the thickness of the second current dispersing layer 244 (hereinafter referred to as "top layer of the current dispersing layer") is not less than 1.0 μm and not more than 3.0 μm, which is less than the thickness of the current dispersing layer 240.

(Convexoconcave Portion 250)

The convexoconcave portion 250 is formed by roughening the surface of the second current dispersing layer 244 provided on the opposite side of the light-emitting portion 20. The convexoconcave portion 250 is formed to have random morphology by etching the surface using an etchant. Furthermore, the covexoconcave portion 250 may be formed to have a predetermined pattern on the surface. Furthermore, it is preferable that the convexoconcave portion 250 is not less than 1.0 μm and not more than 3.0 μm in order to improve a light-extracting effect of the light-emitting element formed from the epitaxial wafer 1.

(Method of Fabricating Epitaxial Wafer 1)

The epitaxial wafer of the first embodiment is, for example, fabricated as fallows. At first, a semiconductor substrate is prepared. A layered structure of III-V group compound semiconductor which comprises plural compound semiconductor layers (i.e. the buffer layer 200, the reflective portion 210, the first cladding layer 220, the active layer 222, the second cladding layer 224, the intermediate layer 230, the first current dispersing layer 242 and the second current dispersing layer 244) is formed on the semiconductor substrate 10, for example, by MOVPE (Metal Organic Vapor Phase Epitaxy) method (growing process). By this method, epitaxial wafer without the convexoconcave portion 250 is fabricated.

The layered structure of the semiconductor is formed by MOVPE method under the predetermined setting of a growth temperature, a growth pressure, each growth velocity of each compound semiconductor layer of the layered structure including plural layers and a ratio of V/III. Herein, the V/III ratio means a molar ratio of group V material such as arsine ($AsH_3$) or phosphine ($PH_3$) to a molar number of group III material such as trimethyl gallium (TMGa) or trimethyl aluminum (TMAl) for standard.

Furthermore, as the raw material for MOVPE method, organic metal compounds such as trimethyl gallium (TMGa) or triethyl gallium (TEGa) for a raw material of Ga, trimethyl aluminum (TMAl) for a raw material of Al, and trimethyl indium (TMIn) for a raw material of 1n may be used. Furthermore, arsine ($AsH_3$) for a raw material of As and hydride gas such as phosphine ($PH_3$) for a raw material of P may be used. Furthermore, for a raw material of n-type dopant, a hydrogen selenide ($H_2Se$) and a disilane ($Si_2H_6$) may be used. For a raw material of p-type dopant, bis-cyclopentadienyl magnesium ($Cp_2Mg$) may be used.

Furthermore, for a raw material of the n-type dopant, monosilane ($SiH_4$), disilane ($Si_2H_6$), diethyletellurium (DETe) or dimethyletellurium (DMTe) may be used. For a raw material of p-type dopant, dimethylezinc (DMZn) or diethylezinc (DEZn) may be used for the alternative of $Cp_2Mg$.

By forming the buffer layer 200 on the semiconductor substrate 10, influence of residual dopant used at a last step of crystal growth (i.e. influence of furnace-inside memory) can be cancelled. By this means, it is possible to fabricate the epitaxial wafer 1 stably. Furthermore, crystallinity of the compound semiconductor layers epitaxially grown on the buffer layer 200 is improved by the epitaxial growth of buffer layer 200 on the semiconductor substrate 10.

For the next step, by applying the convexoconcave treatment (i.e. surface-roughening) on the surface of the second current dispersing layer 244, the convexoconcave portion 250 is formed (process of forming convexoconcave portion). In this embodiment, the surface-roughening is carried out before forming the light-emitting element, i.e., the process is done by erosion method before forming the front surface electrode 30 for completing the light-emitting element 2 which is mentioned later. At this time, it is possible to etch the surface of the second current dispersing layer 244 using a predetermined mask pattern for a mask which is formed on the surface of the second current dispersing layer 244 by photolithography.

The epitaxial wafer 1 of the first embodiment is fabricated by the abovementioned process. The epitaxial wafer 1 is used for an epitaxial wafer for a light-emitting element like LED explained later.

(Examples of Variation)

While the epitaxial wafer 1 of the first embodiment comprises the buffer layer 200 on the semiconductor substrate 10, an epitaxial wafer of a modified example of the first embodiment may be formed without the buffer layer 200.

Furthermore, while the epitaxial wafer 1 of the first embodiment is an epitaxial wafer for a light-emitting element emitting light including red (e.g. the light with a wavelength of 630 nm band), a wavelength of the light emitted from the light-emitting element fabricated from the epitaxial wafer 1 is not limited to this wavelength. It is possible to form an epitaxial wafer for a light-emitting element which can emit light in a predetermined wavelength range, by controlling the structure of the active layer 222. For example, the active layer 222 can emit light for the range of wavelength including orange, yellow or green. Furthermore, the light-emitting portion 20 provided in the epitaxial wafer 1 may be formed from a InAlGaN based compound semiconductor including the active layer 222 which can emit ultraviolet, violet or blue light.

Furthermore, as to the compound semiconductor layers of the semiconductor substrate 10, the buffer layer 200, the reflective portion 210, the first cladding layer 220, the second cladding layer 224, the intermediate layer 230, the first current dispersing layer 242 and the second current dispersing layer 244, which are provided in the epitaxial wafer 1, it is possible to reverse the conductivity type of the compound semiconductor composing these compound semiconductor layers. For example, when the conductivity type of the semiconductor substrate 10, the buffer layer 200, the reflective layer 210 and the first cladding layer 220 may be p-type, the conductivity type of the second cladding layer 224, the intermediate layer 230, the first current dispersing layer 242 and the second current dispersing layer 244 may be n-type.

Furthermore, the active layer 222 may be formed to have a structure of quantum well. The quantum well structure may be formed to have any structure of single quantum well structure, multiple quantum well structure or strained multi quantum well structure. The light-emitting portion 20 may be formed to include other semiconductor layers than the first cladding layer 220, the active layer 222 and the second cladding layer 234.

(Second Embodiment)

FIG. 2A shows a schematic cross sectional view of a light-emitting element of a second embodiment of this invention, and the FIG. 2B shows a schematic plan view of the light-emitting element of the second embodiment of this invention.

The light-emitting element 2 of the second embodiment is formed from the epitaxial wafer 1 of the first embodiment and comprises substantially the same structure as the epitaxial wafer 1 except for a construction having a front surface electrode 30 and a back surface electrode 35. Therefore, explanation in detail is omitted except for the difference.

(Structural Outline of Light-Emitting Element 2)

A light-emitting element 2 of a second embodiment comprises a semiconductor substrate 10, a reflective portion 210 on the semiconductor substrate 10, a first cladding layer 220 on the reflective portion 210, an active layer 222 on the first cladding layer 220, a second cladding layer 224 on the active layer 222, an intermediate layer 230 on the second cladding layer 224 and a current dispersing layer 240 comprising a first current dispersing layer 242 and a second current dispersing layer 244 on the intermediate layer 230. And, the light-emitting element 2 comprises a front surface electrode 30 provided on the second current dispersing layer 244, i.e. on a convexoconcave portion 250, and a back surface electrode 35 provided on the opposite side of the reflective portion 210 in relation to the semiconductor substrate 10.

(Front Surface Electrode 30 and Back Surface Electrode 35)

The front surface electrode 30 is formed from a material which shows ohmic contact to the second current dispersing layer 244. Concretely, the front surface electrode 30 is formed to include at least one metal for p-type electrode which is selected from metals of Be, Zn, Ni, Ti, Pt, Al and Au. For example, the surface electrode 30 is formed as a layered structure which is layered in the order of AuBe, Ni, and Au on the second current dispersing layer 244. In here, the front surface electrode 30 is provided on the opposite side of the intermediate layer 230 in relation to the surface of the current dispersing layer 240, i.e. on a part of the light-extracting surface of the light-emitting element 2.

Furthermore, the front surface electrode 30 is provided on the convexoconcave portion 250. Furthermore, the front surface electrode 30 is formed to have a substantially circular part 30a and four legs 30b stretched from the circular part 30a to four corners viewed from the top of the light-emitting element 2. Alternatively, the shape of the front surface electrode 30 may be formed to have the shape of square, rhombus or polygon.

The back surface electrode 35 is formed from a material which has ohmic contact with the semiconductor substrate 10. For concrete example, the back electrode 35 is formed to include at least one metal for n-type electrode selected from metal of Ge, Ni, Ti, Pt, Al and Au. For example, the back surface electrode 35 is formed to have a layered structure which is layered in the order of AuGe, Ni, and Au on the semiconductor substrate 10. The back surface electrode 35 is formed on the overall back surface or on the substantially overall back surface of the semiconductor substrate 10.

(Method of Fabricating Light-Emitting Element 2)

At first, an epitaxial wafer is prepared in the same way as the first embodiment. Next step is to form plural front surface electrodes 30 on the surface of the epitaxial wafer 1, i.e., on the surface of the second current dispersing layer 244 including the convexoconcave portion 250 (process of fabricating front surface electrode). A lift-off method can be used to form the surface electrode 30. Subsequently, the back surface electrode 35 is formed on the overall back surface of the semiconductor substrate 10. Furthermore, alloying is processed under the predetermined atmosphere (e.g., under inert atmosphere such as nitrogen atmosphere) at a predetermined temperature, and for predetermined time, in order to keep ohmic contact between the front surface electrode 30 and the second current dispersing layer 244 and between the back surface electrode 35 and the semiconductor substrate 10 (alloying process).

Then, plural light-emitting elements 2 are fabricated by cutting the epitaxial wafer, in which the front surface electrode 30 and the back surface electrode 35 are provided, by a size of the light-emitting element to be fabricated (cutting process). Concretely, plural front surface electrodes 30 are made by dicing using dicing apparatus by a size to be fabricated. In here, mechanical damage by the dicing can be cured by etching the end surfaces of the plural light-emitting elements after the dicing.

The light-emitting element 2 fabricated by the abovementioned process is, for example, a light-emitting diode which emits red light near to 634 nm of light-emitting wavelength. Then, a top view of the light-emitting element 2 is square, a side of which is, e.g. 275 μm. The light-emitting element 2 may further comprise pad electrodes on the front surface electrode 30 as pads for wire bonding.

(Advantage of First and Second Embodiments)

The light-emitting element 2 fabricated from the epitaxial wafer 1 in the first embodiment comprises the reflective portion comprising plural pairs of layers including the first semiconductor layer 210a and the second semiconductor layer 210b, a thickness of which are controlled correspondingly to various thickness controlled for the plural incident angles. According to this structure, the reflective portion 210 can reflect the light to the light-extracting side, even if the light enters to the reflective portion 210 with various angles. Furthermore, the light-emitting element 2 comprises the convexoconcave portion 250 at the light-extracting side. Therefore, the light reflected from the reflective portion 210 may be extracted effectively. Accordingly, it is possible to provide the light-emitting element 2 of this embodiment which is improved in the light-extracting efficiency.

Furthermore, in the light-emitting element 2 fabricated from the epitaxial wafer 1 the first embodiment, the front surface electrode 30 is formed after the surface-roughening of the principal face of the epitaxial wafer 1. Therefore, an etchant does not influence the surface of the front surface electrode 30, thereby decreasing the failure of wire bonding. Furthermore, the second current dispersing layer 244, which has either the highest carrier density in the current dispersing layer 240 or the highest impurity density in the current dispersing layer 240, is provided on the top layer of the current dispersing layer 240, so that a high output light-emitting element 2 can be provided without largely increasing the fabricating cost. Furthermore, because the front surface electrode 30 is provided on the convexoconcave portion 250, a contact area between the front surface electrode 30 and the second current dispersing layer 244 becomes increased to reduce the peeling of the front surface electrode 30.

Furthermore, in the light-emitting element 2, the convexoconcave portion 250 is provided at the light-extracting surface. Therefore, even a light reflected from the pairs of layers comprising the first semiconductor layer 210a and the second semiconductor layer 210b, which have thickness defined by large angles θ in the Equations (1) and (2), can be extracted from the light-extracting surface. For this construction, output of the light-emitting element 2 can be improved as compared to a case that a reflective portion is constructed with only a semiconductor layer corresponding to a peak wavelength of the light emitted from the active layer 222, for example. Therefore, in this embodiment, the light-emitting element 2 with high light output can be provided without largely increasing the fabricating cost by the increase of the total number of the compound semiconductor layers grown on the semiconductor substrate 10 and the increase of growth time.

(Third Embodiment)

FIG. 3 is a schematic cross section of a light-emitting element 3 of the third embodiment of the present invention.

A light-emitting element 2a of the third embodiment comprises substantially the same structure as the light-emitting element 2 of the second embodiment except for a construction having a light-extracting layer 40 on the convexoconcave portion 250. Therefore, explanation in detail is omitted except for the difference.

The light-emitting element 2a comprises a light-extracting layer 40 on the surface of the second current dispersing layer 244 in the region excluding the area occupied by the front surface electrode 30, in which a material composing the light-extracting layer 40 is transparent to the light emitted from the active layer 222 and has a refractive index between that of semiconductor composing the current dispersing layer 240 (i.e. the first current dispersing layer 242 and the second current dispersing layer 244) and that of air. The light-extracting layer 40 is formed to have a thickness of d within ±30% of the value defined by $A \times \lambda_p/(4 \times n)$ wherein $\lambda_p$, is an wavelength of a light emitted from the active layer 222, n is a refractive index of a material composing the light-extracting layer 40 and A is a constant (A is odd number).

The light-extracting layer 40 may be formed from an insulator, oxide of a first or second conductivity type, or nitride of a first or second conductivity type. For example, the light-extracting layer 40 may be formed from oxide or nitride like SiN, $SiO_2$, ITO, $Sn_2O_3$, $TiO_2$ and ZnO. Furthermore, the material composing the light-extracting layer 40 does not needs to be conductive. Furthermore, the conductivity type of the materials comprising the light-extracting layer 40 may be any type of p and n.

The light-emitting element 2a can be improved in the light-extracting efficiency, because it comprises the light-extracting layer 40 which is provided between the second current dispersing layer 244 and outer air and has a refractive index between that of the materials composing the second current dispersing layer 244 and that of air.

(Forth Embodiment)

FIG. 4 shows a schematic cross section of the light-emitting element of the forth embodiment.

A light-emitting element 2b of the forth embodiment comprises substantially the same structure as the light-emitting element 2 of the second embodiment except for a construction in which the active layer 222 is provided between a first undoped layer 221 and a second undoped layer 223. Therefore, explanation in detail is omitted except for the difference.

Concretely, the light-emitting element 2b of the forth embodiment comprises a semiconductor substrate 10, a buffer layer 200 on the semiconductor substrate 10, a reflective portion 210 on the buffer layer 200, a first cladding layer 220 on the reflective portion 210, a first undoped layer 221 on the first cladding layer 220, an active layer 222 on the first undoped layer 221, a second undoped layer 223 on the active layer 222, a second cladding layer 224 on the second undoped layer 223, an intermediate layer 230 on the second cladding layer 224, a first current dispersing layer 242 on the intermediate layer 230, a second current dispersing layer 244 on the first current dispersing layer 242, a convexoconcave portion 250 on the second current dispersing layer 244, a front surface electrode 30 on a part of the surface of the second current dispersing layer 244 and a back surface electrode 35 on the overall or substantially overall back surface of the semiconductor substrate 10.

The first undoped layer 221 suppresses an n-type dopant in the cladding layer 220 to be diffused into the active layer 222. Furthermore, the second undoped layer 223 suppresses a p-type dopant in the second cladding layer 224 to be diffused into the active layer 222. Both the first and second undoped layers are formed from $(Al_xGa_{1-x})_yIn_{1-y}P$ which does not include dopant. By sandwiching the active layer 222 between the first undoped layer 221 and the second undoped layer 223, the diffusion of the dopants from the first cladding layer 220 and the second cladding layer 224 to the active layer is suppressed, so that the light-emitting efficiency of the light-emitting portion 20a can be improved and the reliability of the light-emitting element 2b can be improved.

In the light-emitting element 2b of the forth embodiment, the active layer 222 is provided between the undoped layer 221 and the second undoped layer 223. However, in a variation of the forth embodiment, the light-emitting element may be formed without providing one of the first undoped layer 221 and the second undoped layer 223.

EXAMPLES

Example 1

As a light-emitting element of Example 1, a light-emitting element corresponding to the light-emitting element 2 of the second embodiment was fabricated to emit red light, a peak wavelength of which was near to 631 nm. Concretely, at first, on the semiconductor substrate 10 of an n-type GaAs substrate with off-angle of 15°, a buffer layer comprising n-type GaAs (Se doped, a carrier density of $1 \times 10^{18}/cm^3$, and a thickness of 200 nm) and a reflective portion 210 comprising fifteen pairs including AlAs layer for the first semiconductor layer 210a and $Al_{0.5}Ga_{0.5}As$ layer for the second semiconductor layer 210b (i.e. totally thirty layers comprising fifteen layers of the first semiconductor layer 210a and fifteen layers of the second semiconductor layers 210b) have been epitaxially grown. Carrier density of each semiconductor layer composing the reflective portion 210 was controlled about at $1 \times 10^{18}/cm^3$.

Furthermore, on the reflective portion 210, an n-type $(Al_{0.7}Ga_{0.3})_{0.5}In_{0.5}P$ cladding layer (Se doped, a carrier density $4 \times 10^{17}/cm^3$ and a thickness of 400 nm) as the first cladding layer 220, an undoped $(Al_{0.1}Ga_{0.9})_{0.5}In_{0.5}P$ active layer (a thickness of 600 nm) as the active layer 222, a p-type $(Al_{0.7}Ga_{0.3})_{0.5}In_{0.5}P$ cladding layer (Mg-doped, a carrier density of $2 \times 10^{17}/cm^3$ and a thickness of 500 nm) as the second cladding layer 224, a p-type $Ga_{0.7}In_{0.3}P$ intermediate layer (Mg-doped, a carrier density of $6 \times 10^{18}/cm^3$, and a thickness of 20 nm) and a p-type GaP current dispersing layer (Mg-doped, a carrier density of $2 \times 10^{18}/cm^3$ and a thickness of 8000 nm) are epitaxially grown by this order.

Figure 5:
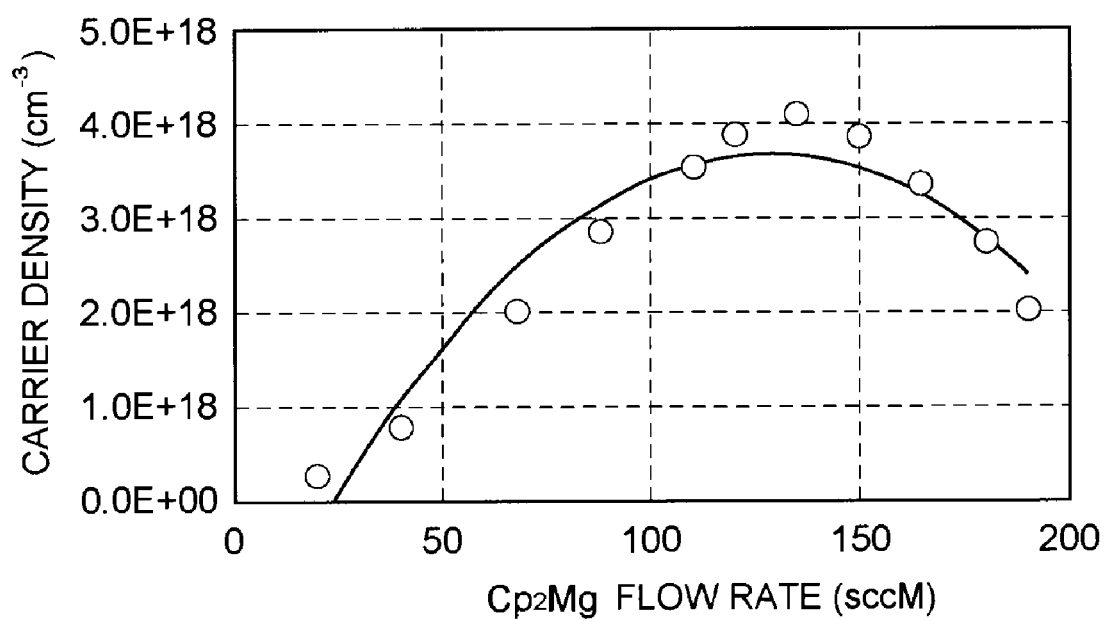
FIG. 5 is a view showing a relation between $Cp_2Mg$ flow rate and carrier density at growing a current dispersing layer in the first embodiment of the invention.

FIG. 5 shows a relation between Cp$_2$Mg flow rate and carrier density when the current dispersing layer was grown in Example 1.

In the case of growing the current dispersing layer 240, concretely the first current dispersing layer 242, Cp$_2$Mg flow rate (Mg flow rate) was set at 68 sccM so that the carrier density of the first current dispersing layer 242 became 2×10$^{18}$/cm$^3$. In a top skin portion of 2000 nm of the second current dispersing layer 244 of the current dispersing layer 240 which had 8000 nm film thickness, the second current dispersing layer 244 was grown so that Mg flow rate was set at the twice of that in the case of growing the first current dispersing layer (i.e., 135 sccM) so that a carrier density became 4×10$^{18}$/cm$^3$. Furthermore, a sample, wherein the flow rate of the second current dispersing layer 244 was set at 190 sccM, was fabricated. According to these processes, the epitaxial wafer of Example 1 was fabricated.

In the MOVPE growth, the growing temperature of a buffer layer of the n-type GaAs to an intermediate layer of the p-type Ga$_{0.7}$In$_{0.3}$P was set at 650° C., and the growing temperature of a p-type GaP current dispersing layer was set at 675° C. Furthermore, in the other growing conditions, the growing pressure was set at 666.1 Pa (50 Torr), and each growing rate of plural compound semiconductor layers is set between 0.3 and 1.5 nm/sec. Furthermore, V/III ratio was set at about 150. The V/III ratio in the growing process of the p-type GaP current dispersing layer was set at 25. Detailed explanation in detail is omitted except for the difference of the raw materials used for the MOVPE growth is omitted because those are explained in the first embodiment.

Next, the reflective portion 210 is explained in detail. The thickness of the AlAs layer of the first semiconductor layer 210a and the thickness of the Al$_{0.5}$Ga$_{0.5}$As layer of the second semiconductor layer 210b for composing the reflective portion 210 were controlled to have thickness which were calculated by the Equations (1) and (2). More concretely, $\lambda_p$ was set at a peak wavelength "631 nm" of light emitted from the undoped (Al$_{0.1}$Ga$_{0.9}$)$_{0.5}$In$_{0.5}$P active layer, $n_A$ was set at "3.114" which was a refractive index of AlAs layer, $n_B$ was set at "3.507" which was a refractive index of Al$_{0.5}$Ga$_{0.5}$As layer, $n_{fm}$ was set at "3.127" which was a refractive index of the n-type cladding layer comprising (Al$_{0.7}$Ga$_{0.3}$)$_{0.5}$In$_{0.5}$P. Furthermore, an angle θ in the Equations (1) and (2) was set at 0, 20, 30, 40, 50, 60 and 70°. In here, θ of both AlAs layer and Al$_{0.5}$Ga$_{0.5}$As layer which composed a pair of layers were the same value.

Concretely, a structure of the reflective portion 210 formed in the epitaxial wafer for the light-emitting element of Example 1 was as follows. At first, two pairs of layers (hereinafter referred to as "70° DBR layer") comprising AlAs layer and Al$_{0.5}$Ga$_{0.5}$As layer, in which thickness were calculated by Equations (1) and (2) and θ was set at 70°, were formed. Next, two pairs of layers (hereinafter referred to as "60° DBR layer") comprising AlAs layer and Al$_{0.5}$Ga$_{0.5}$As layer, in which thickness were calculated by Equations (1) and (2) and θ was set at 60°, were formed on the 70° DBR layer. Then, a pair of layers (hereinafter referred to as "50° DBR layer") comprising AlAs layer and Al$_{0.5}$Ga$_{0.5}$As layer, in which thickness were calculated by Equations (1) and (2) and θ was set at 50°, were formed on the 60° DBR layer.

Furthermore, a pair of layers (hereinafter referred to as "40° DBR layer") comprising AlAs layer and Al$_{0.5}$Ga$_{0.5}$As layer, in which thickness were calculated by Equations (1) and (2) and θ was set at 40°, were formed on the 50° DBR layer. Two pairs of layers (hereinafter referred to as "30° DBR layer") including AlAs layer and Al$_{0.5}$Ga$_{0.5}$As layer, in which thickness were calculated by Equations (1) and (2) wherein θ was set at 30°, were formed on the 40° DBR layer.

Furthermore, six pairs of layers (hereinafter referred to as "20° DBR layer") comprising AlAs layer and Al$_{0.5}$Ga$_{0.5}$As layer, in which thickness were calculated by Equations (1) and (2) and θ was set at 20°, were formed on the 30° DBR layer. A pair of layers (hereinafter referred to as "0° DBR layer") comprising AlAs layer and Al$_{0.5}$Ga$_{0.5}$As layer, in which thickness were calculated by Equations (1) and (2) and θ was set at 0°, were formed for a top layer on the 20° DBR layer. Such a reflective portion 210 comprising fifteen pairs of layers was formed on the n-type GaAs buffer layer.

The reason why the reflective portion 210 of the light-emitting element of Example 1 comprises fifteen pairs (the thickness of the reflective portion 210 was slightly smaller than 2000 nm) is to compare Example 1 with a Comparative Example 1 by forming the reflective portion 210 having the same thickness as the reflective portion 212 of the light-emitting element of the following Comparative Example 1 which comprises twenty one pairs (the thickness of the reflective portion 212 was slightly larger than 2000 nm). According to this, the epitaxial wafer having no convexoconcave portion 250 of Example 1 was fabricated.

(Structure of Reflective Portion 210)

Figure 6A:
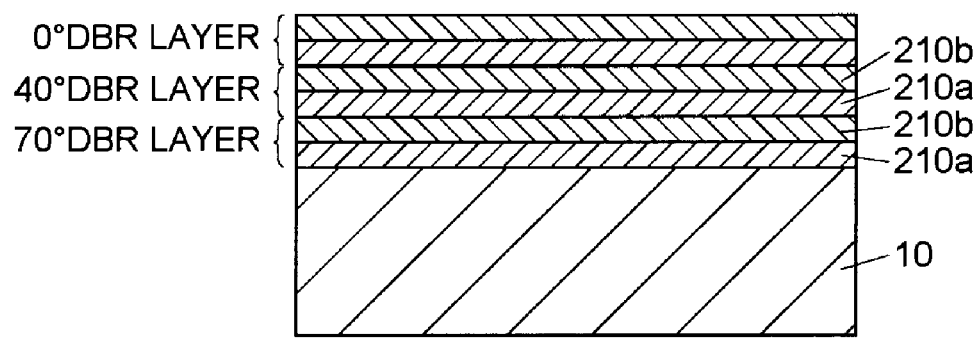
FIG. 6A is a schematic structure of a reflective portion provided in a light-emitting element in the first embodiment of the invention.
Figure 6B:
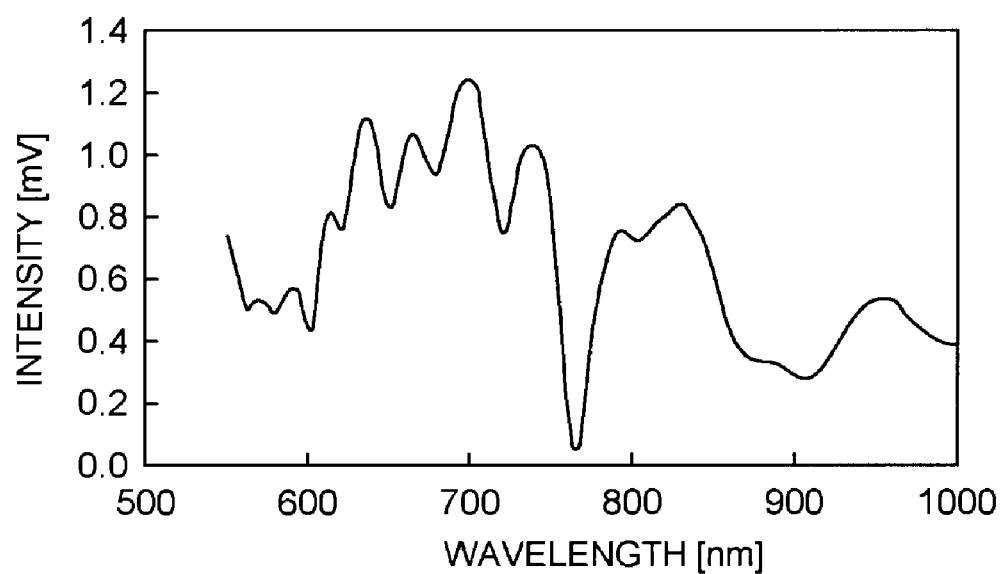
FIG. 6B is a view showing a reflectivity spectrum in a schematic structure of a reflective portion provided in a light-emitting element in the first embodiment of the invention.

FIG. 6A shows a schematic structure of the reflective portion composing the light-emitting element of Example 1, and FIG. 6B shows a reflectivity spectrum in the schematic structure of the reflective portion in the light-emitting element of Example 1. Furthermore, FIG. 7A shows a schematic structure of the reflective portion in the light-emitting element which comprises 0° DBR layer, and FIG. 7B shows a spectrum of reflectivity in the schematic structure of the reflective portion in the light-emitting element including the 0° DBR layer.

Referring to FIG. 6A, the schematic structure of the reflective portion 210 in the light-emitting element of Example 1 comprises 70° DBR layer, 40° DBR layer and 0° DBR layer which were layered by this order on the n-type GaAs substrate as the semiconductor substrate 10. Referring to FIG. 6B, according to the measurement of reflectivity spectrum, it was shown that the reflective portion 210 comprising such a structure reflected a light with various wavelengths.

Figure 7A:
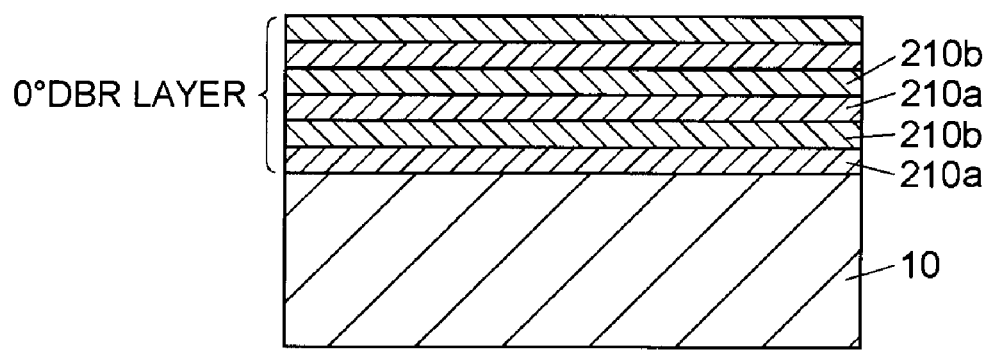
FIG. 7A is a schematic structure of a reflective portion provided in a light-emitting element comprising a 0° DBR layer.
Figure 7B:
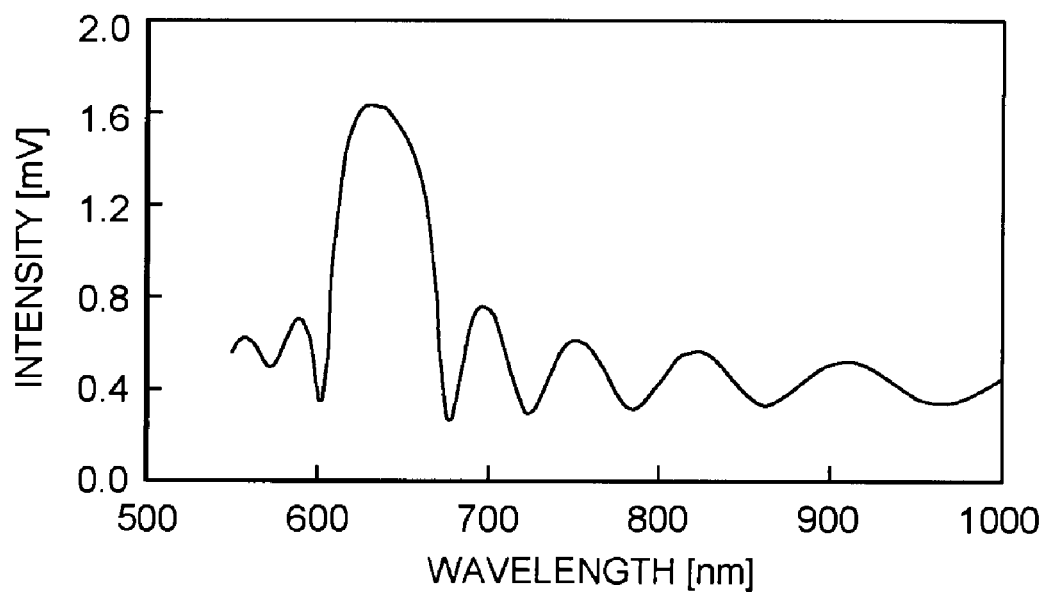
FIG. 7B is a view showing a reflectivity spectrum in a schematic structure of the reflective portion provided in the light-emitting element comprising the 0° DBR layer.

Meanwhile, referring to FIG. 7A, the schematic structure of the reflective portion in the light-emitting element comprising 0° DBR layers had a structure in which three O'DBR layers were formed on the n-type GaAs substrate corresponding to the semiconductor substrate 10. According to the measurement of the reflectivity spectrum in the reflective portion of this structure, referring to the FIG. 7B, it was shown that a light having the peak around 640 nm was mainly reflected.

(Roughness of Convexoconcave Portion 250)

Next, an epitaxial wafer having no convexoconcave portion 250 of Example 1 was divided into four small pieces with a quarter size from the original by cleavage after exportation from MOVPE apparatus. One small piece with a quarter size of the original formed from the epitaxial wafer having no convexoconcave portion 250 of Example 1 was kept as grown for comparison. Three pieces with a quarter size of the original formed from the epitaxial wafer having no convexoconcave portion 250 of Example 1 were subjected to surface finishing (roughening) to form the convexoconcave portion on the second current dispersing layer 244.

The surface-roughening was processed using an acetic acid based etchant. The convexoconcave treatment (surface-roughening) was processed for three patterns by varying the etching (surface roughening) time. In other words, the convexoconcave portion on the surface of the current dispersing layer was formed to have different morphologies dependently on the etching time (surface-roughening time). The etching time (surface-roughening time) was set to three patterns of 15, 30, 60 sec. As a result of evaluating the surface convexo-concave portion on the second current dispersing layer 244 which was formed by varying the etching time (roughening time), the maximum height Ry of the convexoconcave portions was not less than 1.4 µm nor more than 2.6 µm.

Figure 8:
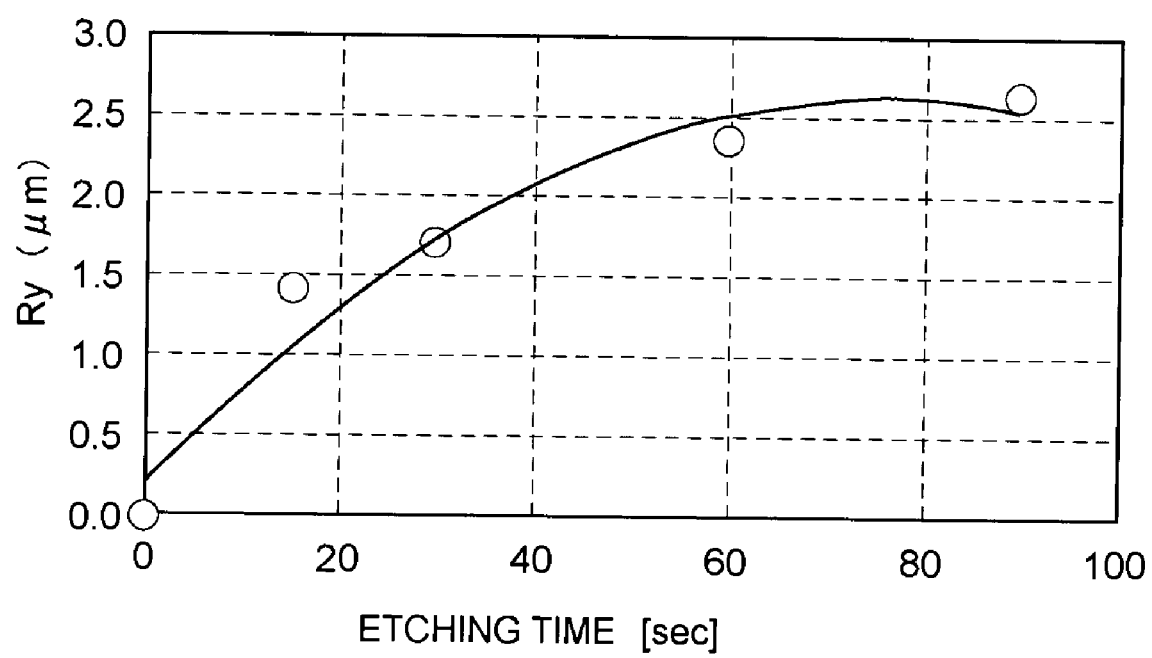
FIG. 8 is a view showing a relation between maximum height Ry and time requested for surface-roughening of an epitaxial wafer without a convexoconcave portion.

FIG. 8 shows a relation between a time for roughening an epitaxial wafer having no convexoconcave portion and the maximum height Ry.

FIG. 8 shows surface roughness in the case where surface-roughening was carried out with an etching time of 90 sec. Referring to FIG. 8, it was shown that Ry became higher than 1.4 µm by keeping the etching time (roughening time) longer than 15 sec.

Front surface electrodes 30 each having a circular part with 100 µm diameter and four legs stretched from the outer edge of the circular part were formed to be aligned as matrix, on the surfaces of the three small pieces having the quarter size of the epitaxial wafer of Example 1 (i.e. the top surface of the wafer which was the front surface of the second current dispersing layer 244), which were roughened by the abovementioned manner as well as on the surface of the one small piece of that (i.e. the top surface of the wafer which was the surface of the second current dispersing layer 244), which was not roughened. The front surface electrodes 30 were formed by photolithography method. In other words, after a photo-resist was coated on the surface of the epitaxial wafer, mask patterns, which had an aperture at each region where the plural front surface electrodes 30 should be formed, were formed on the surface of the epitaxial wafer by photolithography method using mask aligner. Then, AuBe with a thickness of 400 nm and Ni with a thickness of 10 nm were deposited in this order by vacuum deposition method. After the deposition, the front surface electrodes 30 were formed on the epitaxial wafer by removal of the mask patterns formed on the epitaxial wafer using lift off method.

Next, a back surface electrode 35 was formed on the back side of the epitaxial wafer, i.e. the whole surface of the opposite side of the front surface where the front surface electrode 30 was formed by vacuum deposition method. The back surface electrode 35 was formed by depositing AuGe with 60 nm thickness, Ni with 10 nm thickness and Au with 500 nm thickness in this order. After the formation of the front surface electrode 30 and the back surface electrode 35, an alloying process was done to alloy the electrodes. Concretely, the epitaxial wafer, on the both surfaces of which the front surface electrode 30 and the back surface electrode 35 were formed, were heated 5 minutes at 400° C. in an nitrogen gas atmosphere. According to these processes, the epitaxial wafer with the electrodes for the light-emitting element of Example 1 and the epitaxial wafer with the electrodes for comparison with Example 1 were fabricated.

Subsequently, the epitaxial wafer with the electrodes for the light-emitting element of Example 1, i.e. the three pieces of the quarter size having the roughened surfaces (i.e. small pieces in which the surfaces were roughened by etching for 15, 30 and 60 sec), and the epitaxial wafer with the electrodes for comparison with Example 1 (i.e. a quarter sized piece without surface-roughening) were cut by dicing apparatus so that the front surface electrode 30 should be centered.

According to these processes, an LED bare chip with no treatment of surface-roughening (i.e. LED bare chip for comparison formed from the epitaxial wafer without the convexoconcave portion 250 of Example 1) and three kinds of LED bare chips of Example 1 (i.e. LED bare chips with surface-roughening for 15, 30 and 60 sec) were fabricated. In here, each chip size was 275 µm square.

Next, each fabricated LED bare chip was die-bonded on a TO-18 stem using Ag paste. Then, wires using Au were wire-bonded on the front surface electrode 30 of the LED bare chips mounted on the TO-18 stems so that the light-emitting elements of Example 1 and for comparison with Example 1 were fabricated.

Table 1 shows the result of an evaluation of initial characteristics of the light-emitting elements of Example 1 and for the comparison with Example 1. Each light-emitting element used for the evaluation was sampled out of nearly the center of the epitaxial wafer. Furthermore, light-emitting outputs in the Table 1 were those at the flowing current of 20 mA.

TABLE 1

| | Surface-roughening time (sec) | | | |
|---|---|---|---|---|
| | 0 | 15 | 30 | 60 |
| Output of light-emitting (mW) | 2.163 | 2.745 | 2.757 | 2.802 |
| Forward voltage (V) | 1.873 | 1.878 | 1.879 | 1.892 |
| Peak wavelength of emitted light (nm) | 634.2 | 634.3 | 634.9 | 634.5 |

Referring to Table 1, the light-emitting output of the light-emitting element for comparison with Example 1 (i.e. the light-emitting element having no convexoconcave portion 250 on the surface) is 2.163 mW, which is lower than 2.250 mW of the light-emitting element of Comparative Example 1 by about 4%. The light-emitting output of the light-emitting element of Example 1 (i.e. the light-emitting element with the convexoconcave portion 250 on the surface) is improved to 2.745 through 2.802 mW, which is larger than that of the light-emitting element of Comparative Example 1 about 22 to 25%. Furthermore, though, in Example 1, the convexoconcave portion 250 was formed on the surface of the second current dispersing layer 244 before forming the front surface electrode 30, no increase of the forward voltage and no change of the peak wavelength were observed. Further, a light-emitting element using a sample, which was fabricated under the condition in which Mg flow rate was 190 sccM at growing the second current dispersing layer 244, was fabricated by the same way as Example 1. In this light-emitting element, the same LED characteristics were observed as Example 1.

As described above, it was revealed that the epitaxial wafer in which LED characteristics could be substantially determined with the configuration of the epitaxial wafer for LED could be provided. It seemed that the forward voltage was a little high, but that was in the range of error by dispersion. Even if the forward voltage is increased, there is no problem in practice as long as the forward voltage is in the range of the Table 1.

Furthermore, a reliability test of the light-emitting element of Example 1 was carried out. Concretely, the reliability test was an electric current test for 168 hours under the condition in which an electric current of 50 mA flowed through the light emitting element in a room temperature. From the result of the reliability test, any light-emitting element of Example 1 showed a relative output of 97% to 105%. The relative output was calculated by (light-emitting output)/(initial light-emitting output)×100%. Therefore, it was confirmed that the reliability of the light-emitting element of Example 1 was substantially the same as the light-emitting element of following Comparative Example 1. The current values for evaluation before and after the electric current flow of 50 mA were 20 mA.

Accordingly, the surface roughening for the light-emitting element of Example 1 can be done easily because the surface of the second current dispersing layer 244 is roughened before the formation of the front surface electrode 30, so that the front surface electrode 30 need not be protected from etchant, in comparison with a case in which roughening is processed after the formation of the front surface electrode 30. Furthermore, because the front surface electrode 30 is formed after the roughening, failures of wire-bonding caused by contact of the front surface electrode 30 with the etchant can be lowered and the contact area between the front surface electrode 30 and the second current dispersing layer 244 can be increased to suppress pealing of the front surface electrode 30. Therefore, it was possible to fabricate a low cost light-emitting element with 1.25 times light-emitting output of the light-emitting element of the later-describing Comparative Example 1. In Example 1, it was shown that the epitaxial wafer with the configuration of which LED characteristics could be substantially decided could be provided with low cost. In here, in the case of forming the convexoconcave portion 250, etching process is adopted, so that the fabricating cost can be reduced by a batch process in which many pieces can be etched at once.

Furthermore, in the light-emitting element of Example 1, it was revealed that the forward voltage could be lowered by setting the carrier density of the first current dispersing layer 242 higher than that of the second current dispersing layer 244. Furthermore, even in the case that the carrier density of the second current dispersing layer 244 was substantially the same as that of the first current dispersing layer 242, it was confirmed that increasing Mg quantity doped into the second current dispersing layer 244 had the same effect as increasing the carrier density thereof. In other words, it was revealed that increasing Mg quantity doped into the second current dispersing layer 244 rather than increasing the carrier density of the second current dispersing layer 244 was effective to reduce the forward voltage of the light-emitting element.

There may be a possibility that increasing Mg content in a whole current dispersing layer 240 can lower the forward voltage of the light-emitting element. However, in the case of increasing Mg content in the whole current dispersing layer 240, Mg may diffuse into the light-emitting portion 20, thereby lowering the reliability. Furthermore, when the second current dispersing layer 244 is too thinned, the effect of reducing the forward voltage by the second current dispersing layer 244 is lowered so that the forward voltage often increases. On the other hand, when the second current dispersing layer 244 is too thickened, there are cases that the reliability of the light-emitting element decreases, so that the light-emitting output may be reduced by light absorption of Mg (i.e. absorption of light by impurity). Therefore, it is preferable that the thickness of the second current dispersing layer 244 is not less than 1.0 μm and not more than 3.0 μm.

Example 2

For a light-emitting element of Example 2, a light-emitting element, in which the reflective portion 210 was different from that of the light-emitting element of Example 1, was fabricated. However, the Mg flow rate was 68 sccM at growing the first current dispersing layer 242, and at the same time, the carrier density of the first current dispersing layer 242 was $2 \times 10^{18}/cm^3$. Because other configurations without the reflective portion 210 were the same as those of Example 1, explanation in detail is omitted except for the difference.

The configuration of the reflective portion 210 in the light-emitting element of Example 2 was as follows. The reflective portion 210 of Example 2 was formed by growing a pair of 0° DBR layers, six pairs of 20° DBR layers, two pairs of 30° DBR layers, a pair of 40° DBR layers, a pair of 50° DBR layers, two pairs of 60° DBR layers and two pairs of 70° DBR layers in this order on the n-type GaAs buffer layer. In other words, the configuration of the pairs in the reflective portion 210 of Example 2 was a reverse configuration of the pairs in the reflective portion 210 of Example 1.

In the light-emitting element of Example 2, it was confirmed that the LED characteristics (i.e. light-emitting output, light-emitting wavelength, forward voltage, and reliability) were the same as those of the light-emitting element of Example 1. The light-emitting output of the light-emitting element of Example 2 was about 1.25 times of the light-emitting element of Comparative Example 1, and the forward voltage was below 1.9 V. Accordingly, it was revealed that even if the configuration of the pair of layers in the reflective portion 210 was reverse to that of Example 1, the light-emitting element showing good LED characteristics could be fabricated.

Example 3

For a light-emitting element of Example 3, a light-emitting element, in which the reflective portion 210 was different from that of the light-emitting element of Example 1, was fabricated. However, the Mg flow rate was 68 sccM at growing the first current dispersing layer 242, and at the same time, the carrier density of the first current dispersing layer 242 was $2 \times 10^{18}/cm^3$. Because other configurations without the reflective portion 210 were the same as those of Example 1, explanation in detail is omitted except for the difference.

Figure 9:
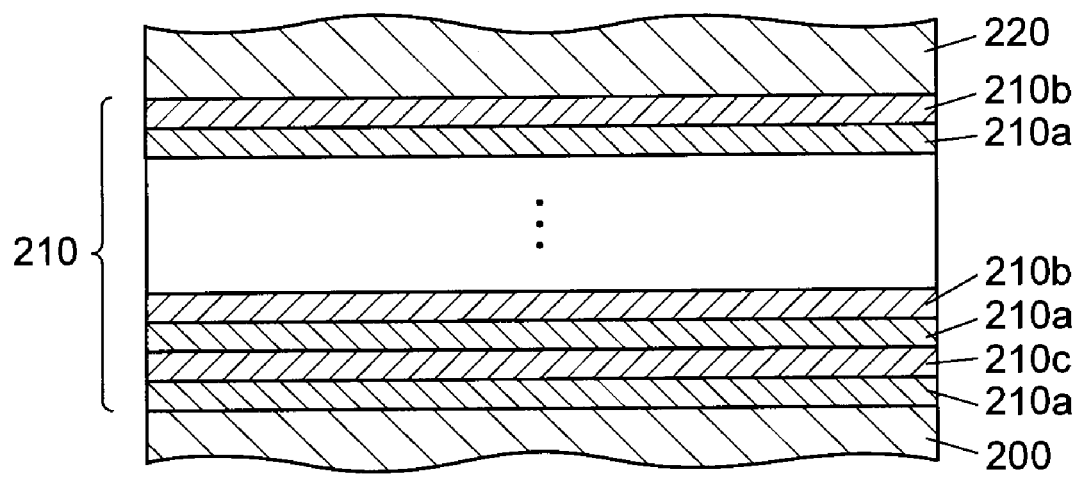
FIG. 9 is a schematic cross section of a light-emitting element in the third embodiment.

FIG. 9 shows the schematic cross section of the reflective portion in the light-emitting element of Example 3.

A configuration of the reflective portion 210 in the light-emitting element of Example 3 was as follows. That is, the reflective portion 210 of Example 3 was formed by growing one pair of 0° DBR layers, two pairs of 70° DBR layers, two pairs of 60° DBR layers, one pair of 50° DBR layers, one pair of 40° DBR layers, three pairs of 30° DBR layers, four pairs of 20° DBR layers and one pair of 10° DBR layers in this order on the n-type GaAs buffer layer. In Example 3, the second semiconductor layer of the first pair of 0° DBR layers was formed from GaAs. Namely, in Example 3, the 0° DBR layer in contact with the first cladding layer 220 of the reflective portion 210 of Example 1 was positioned on the n-type buffer layer, at the same time, a second semiconductor layer 210c composing the 0° DBR layer was formed from GaAs which was an opaque semiconductor material for the light emitted from the active layer 222.

In the light-emitting element of Example 3, it was confirmed that the LED characteristics (i.e. light-emitting output, light-emitting wavelength, forward voltage, and reliability) were the same as those of the light-emitting element of Example 1. That is, the light-emitting output of the light-emitting element of Example 3 was about 1.28 times of the light-emitting element of Comparative Example 1, and the forward voltage was below 1.9 V.

The light-emitting output of the light-emitting element of Example 3 was increased to be higher than that of the light-emitting element of Examples 1 and 2. This resulted from an increase of the reflectivity of the reflective portion 210, because the difference of the refractive index between the first semiconductor layer 210 comprising AlAs and the second semiconductor layer 210c comprising GaAs was larger than the difference of the refractive index between the first semiconductor layer 210a comprising AlAs and the second semiconductor layer 210b comprising $Al_{0.5}Ga_{0.5}As$. The layer comprising GaAs absorbs the light emitted from the active layer 222. Therefore, when all of the second semiconductor layer of the reflective portion 210 consists of GaAs, the output of the light-emitting element decreases. Therefore, it is preferable that the bottom layer of the reflective portion 210, i.e. the pair of layers provided at the farthest position from the active layer 222 consists of GaAs. This is because, when the number of the pair of layers included in the reflective portion 210 is not increased, increase of the reflectivity as compared to the light absorption is effective for the lowermost layer of the reflective portion 210 to increase the output of the light-emitting.

Comparative Example 1

Figure 10:
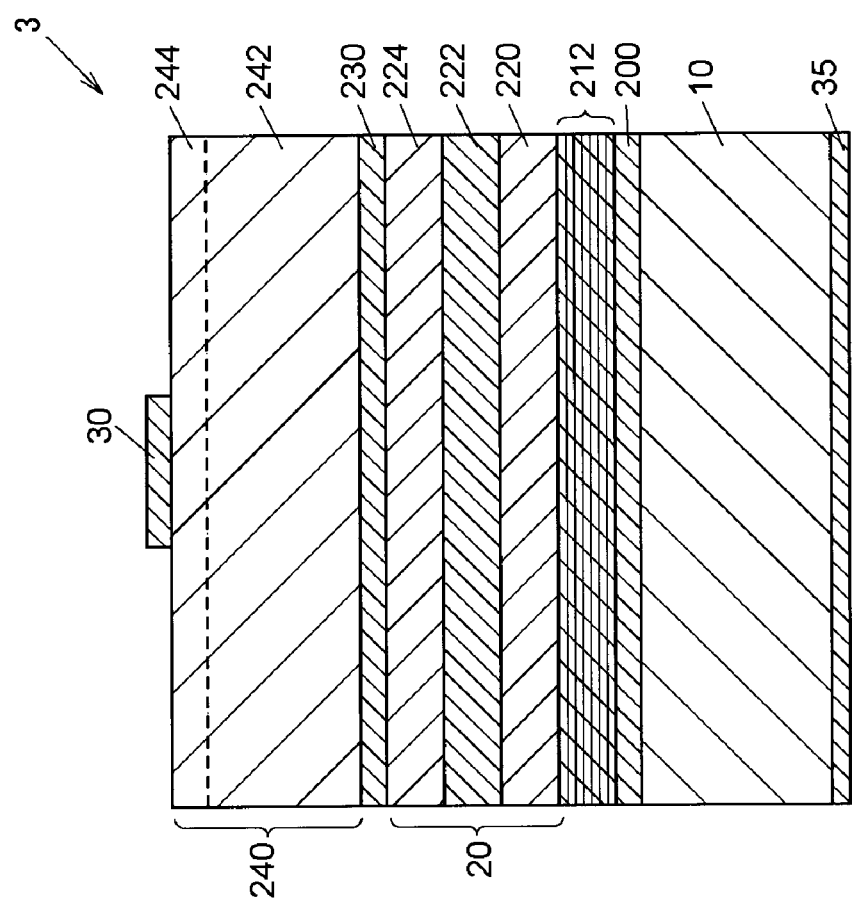
FIG. 10 is a schematic cross section of a light-emitting element in a Comparative Example 1.
Figure 11:
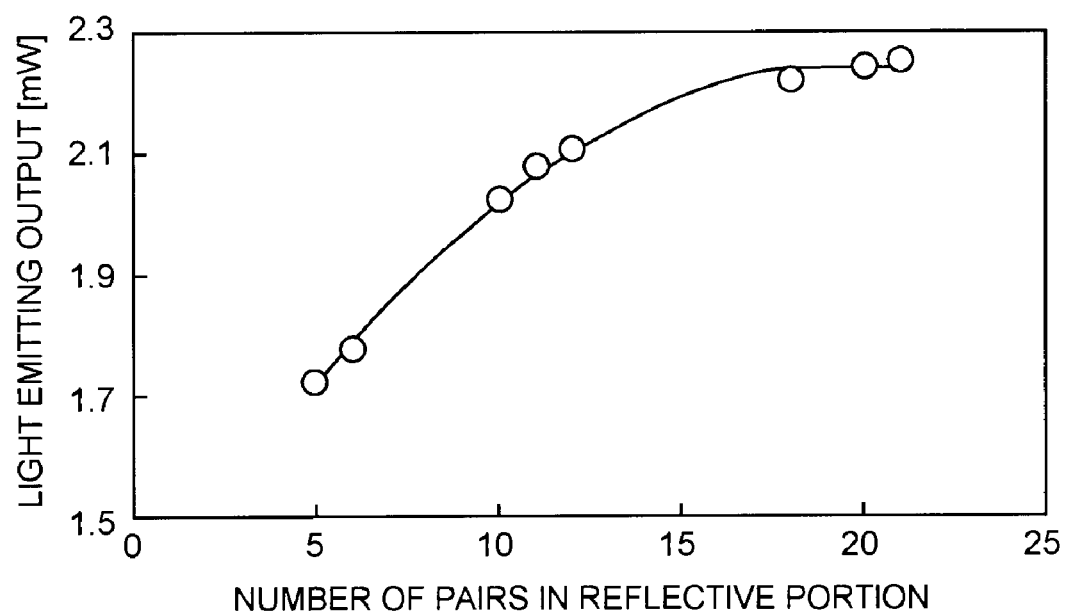
FIG. 11 is a view showing light-emitting output dependence on number of pairs in reflective portion in Comparative Example 1.

FIG. 10 shows the schematic cross section of a light-emitting element of Comparative Example 1, and FIG. 11 shows the dependence of the light-emitting output on the number of the pair of layers in the reflective portion of the light-emitting element of Comparative Example 1.

The light-emitting element of Comparative Example 1 has substantially the same configuration as Example 1. Therefore, explanation in detail is omitted except for the difference from the light-emitting element of Example 1.

Difference between the light-emitting element of Comparative Example 1 and the light-emitting element of Example 1 is that the film thickness of the semiconductor layer comprising the reflective portion 212 was defined by the thickness calculated from $\lambda_p/4n$. Herein, $\lambda_p$ was a peak wavelength of the light emitted from the active layer 222 and n was a refractive index of the first semiconductor layer or the second semiconductor layer.

At first, the reflective portion 212 of the light-emitting element of Comparative Example 1 comprises plural pairs of layers comprising AlAs layer for the first semiconductor layer and $Al_{0.5}Ga_{0.5}As$ layer for the second semiconductor layer. Then, when the peak wavelength is assumed to be 631 nm, the thickness $T_A$ of AlAs for the first semiconductor layer of Comparative Example 1 is represented by $T_A=631/4\times3.114$ ("3.114" is the refractive index of AlAs layer), which is 50.7 nm. Furthermore, the thickness $T_B$ of $Al_{0.5}Ga_{0.5}As$ for the second semiconductor layer of Comparative Example 2 is represented by $T_B=631/4\times3.507$ ("3.507" is the refractive index of $Al_{0.5}Ga_{0.5}As$), which is 45.0 nm. Therefore, the light-emitting element of Comparative Example 1 was fabricated so as to comprise the reflective portion 212 comprising the pair of layers of the first and second semiconductor layers of such thickness.

Furthermore, referring to FIG. 11, when the number of pairs of layers included in the reflective portion 212 was changed, the light output of the light-emitting element of Comparative Example 1 saturated when the number of pairs of layers included in the reflective portion 212 was larger than 20. Therefore, the number of pairs of layers composing reflective portion 212 was decided to be more than 20. With considering the easiness of comparison using the thickness of the reflective portion 212, the number of pairs was controlled so that the thickness of the reflective portion 212 became substantially 2000 nm. Concretely, the number of the reflective portion 212 of Comparative Example 1 was 21 pairs. The thickness of the reflective portion 212 was 2010 nm.

Furthermore, for the light-emitting element of Comparative Example 1, not only the light-emitting element without the convexoconcave portion 250 but also the light-emitting element with the convexoconcave portion 250 was fabricated. Concretely, as the same as Example 1, an epitaxial wafer with the electrodes for light-emitting element was quartered and one piece without roughening process and three pieces with roughening processes each varying the etching time (i.e. roughening time) were fabricated. The etching time (roughening time) was three patterns of 15, 30 and 60 seconds in the same manner as Example 1. It was confirmed that the surface of the current dispersing layer formed by surface-roughening process had substantially the same Ry. Table 2 shows the light-emitting characteristics of Comparative Example 1.

TABLE 2

|  | Surface-roughening time (sec) | | | |
| --- | --- | --- | --- | --- |
|  | 0 | 15 | 30 | 60 |
| Light emitting output (mW) | 2.250 | 2.042 | 2.041 | 2.077 |
| Comparison(%) with light emitting output for surface-roughening time 0 sec | 100 | 90.8 | 90.7 | 92.3 |

Referring to Table 2, the light-emitting output of the light-emitting element of Comparative Example 1 without roughening process, namely, having no convexoconcave portion was 2.25 mW. Furthermore, it was confirmed that the light-emitting output of the light emitting element with surface-roughening process was 10% lower than that of the light emitting element having no convexoconcave portion. In the case of the light-emitting element of Comparative Example 1, the light-emitting output was reduced for the surface-roughening process of the current dispersing layer. In other words, it was confirmed that, in Comparative Example 1, the surface-roughening of the current dispersing layer reduced the light output, and that the configurations of the light-emitting element explained in Examples were required in order to increase the light-emitting output.

Comparative Example 2

Figure 12:
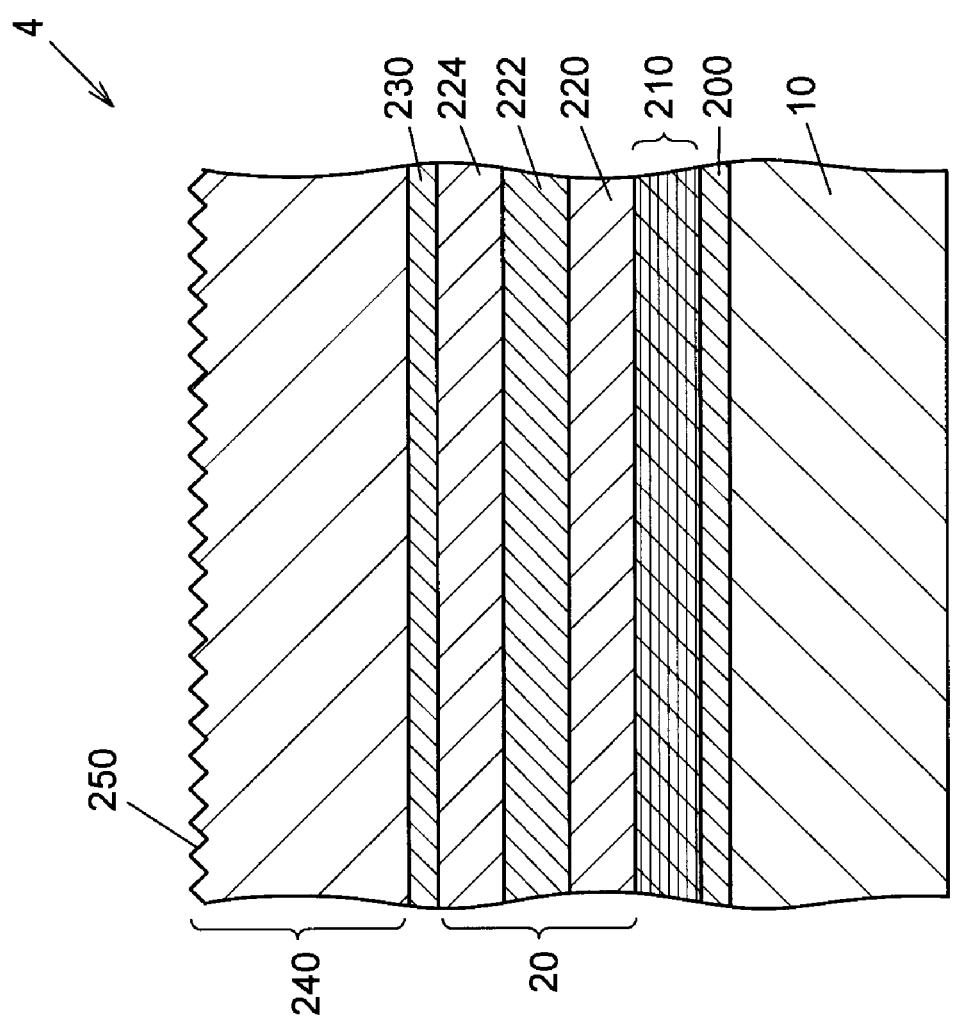
FIG. 12 is a cross sectional view of an epitaxial wafer for light-emitting element in Comparative Example 2.
Figure 13:
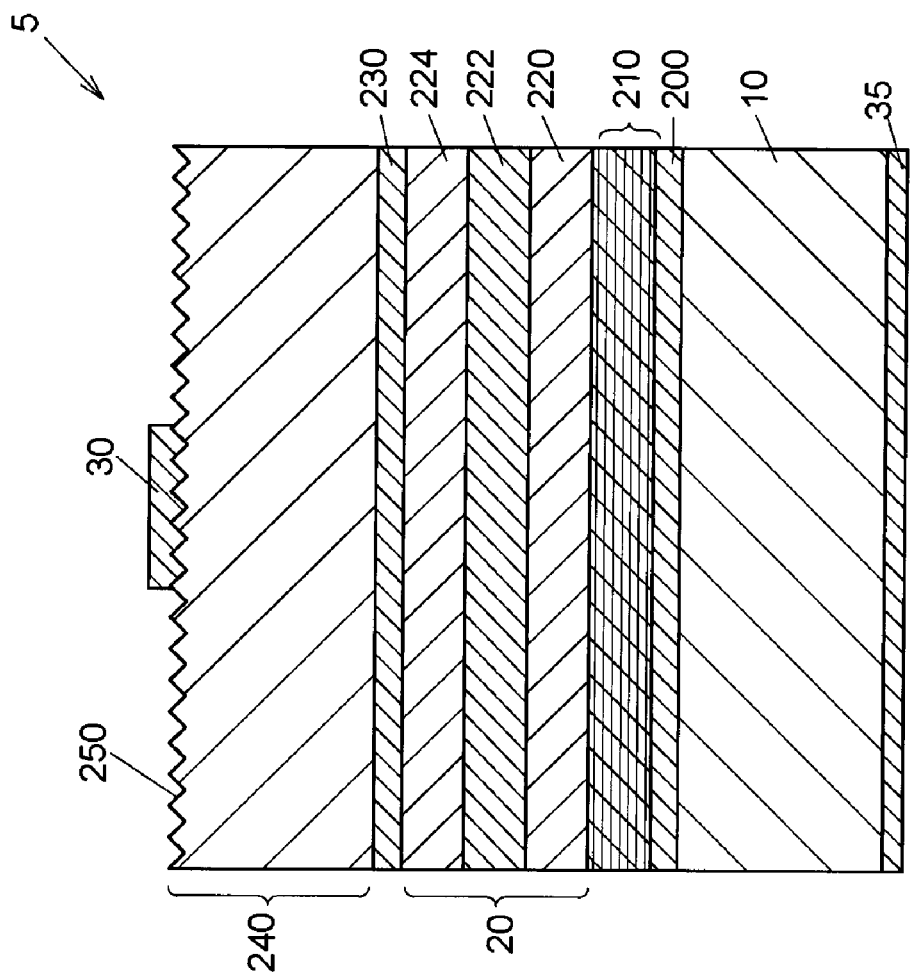
FIG. 13 is a cross sectional view of a light-emitting element in Comparative Example 2.

FIG. 12 shows a schematic cross section of the epitaxial wafer for a light-emitting element of Comparative Example 2, and FIG. 13 shows a schematic light-emitting element of Comparative Example 2.

The light-emitting element of Comparative Example 2 has substantially the same configuration and functions as Example 1 except for a configuration of the current dispersing layer 240 and a forming order of the front surface electrode 30. Therefore, explanation in detail is omitted except for the difference.

An epitaxial wafer for the light-emitting element of Comparative Example 2 comprises a current dispersing layer of 8000 nm film thickness for the current dispersing layer 240, in which it is meant that the epitaxial wafer for the light-emitting element of Comparative Example 2 does not have the second dispersing layer 244 and that the current dispersing layer 240 corresponds to the first current dispersing layer 242 of Example 1. These are different points from Example 1. Furthermore, the light-emitting element 5 of Comparative Example 2 was fabricated from the epitaxial wafer 4 in which the convexoconcave portion 250 was formed on the surface of the current dispersing layer 240 before forming the front surface electrode 30, in which the forming order thereof was the same as Example 1.

According to the evaluation of initial characteristics of the light-emitting element 5 of Comparative Example 2, the forward voltage was larger than 2.5 Volt. Namely, it was revealed that, because the light-emitting element 5 of Comparative Example 2 did not comprise the second current dispersing layer 244, as different from Example 1, the forward voltage rose up to result in problem in practice by conducting the surface-roughening of the current dispersing layer 240 before forming the front surface electrode 30.

Although the embodiments and the examples of the invention have been described, the invention according to claims is not to be limited to the above-mentioned embodiments and examples. Further, please note that not all combinations of the features described in the embodiments and examples are not necessary to solve the problem of the invention.

What is claimed is:

1. An epitaxial wafer, comprising:
   a semiconductor substrate;
   a light-emitting portion including an active layer provided between a first cladding layer of a first conductivity type and a second cladding layer of a second conductivity type different from the first conductivity type;
   a reflective portion which is provided between the semiconductor substrate and the light-emitting portion and which reflects a light emitted from the active layer; and
   a current dispersing layer provided on an opposite side of the reflective portion in relation to the light-emitting portion, and including first and second current dispersing layers having different carrier densities and impurity densities from each other,
   wherein the reflective portion includes plural pairs of layers each including a first semiconductor layer and a second semiconductor layer different from the first semiconductor layer,
   wherein the first semiconductor layer has a thickness of $T_A$ defined by Equation (1), $$T_A = \frac{\lambda_p}{4 n_A \sqrt{1 - \left(\frac{n_{In} \sin\theta}{n_A}\right)^2}} \quad (1)$$

wherein $\lambda_p$ is a wavelength at a peak of the light emitted from the active layer, $n_A$ is a refractive index of the first semiconductor layer, $n_B$ is a refractive index of the second semiconductor layer, $n_{In}$ is a refractive index of the first cladding layer and $\theta$ is an incident angle to the second semiconductor layer,
   wherein the second semiconductor layer has a thickness of $T_B$ defined by Equation (2), $$T_B = \frac{\lambda_p}{4 n_B \sqrt{1 - \left(\frac{n_{In} \sin\theta}{n_B}\right)^2}} \quad (2)$$

wherein the second current dispersing layer has a higher carrier density than the first current dispersing layer or has a higher impurity density than the first current dispersing layer, and the second current dispersing layer is provided with a convexoconcave portion on the surface.

2. The epitaxial wafer according to claim 1, wherein the reflective portion comprises at least three pairs of layers, wherein a thickness of each pair of layers is different from each other according to differences of $\theta$ in Equations (1) and (2) for each pair of layers,
   wherein at least one pair of layers includes first and second semiconductor layers which are defined by a value of $\theta$ larger than 50°.

3. The epitaxial wafer according to claim 2, further comprising:
   an intermediate layer provided between the second cladding layer and the current dispersing layer,
   wherein the intermediate layer is formed from a semiconductor having a bandgap energy between that of a semiconductor composing the second cladding layer and that of a semiconductor composing the current dispersing layer.

4. The epitaxial wafer according to claim 3, wherein the first and second semiconductor layers are transparent to a light emitted from the active layer, and comprising an AlGaAs based semiconductor which has a larger bandgap energy than that of a semiconductor composing the active layer,
   wherein an Al composition of the semiconductor layer composing the first semiconductor layer is different from that of the second semiconductor composing the second semiconductor layer.

5. The epitaxial wafer according to claim 4, wherein one of the first and second semiconductor layers of a pair of layers positioned firstly in the reflective portion relative to the semiconductor substrate or one of the first and second semiconductor layers of pairs of layers positioned firstly and secondly therein relative to the semiconductor substrate are formed from a semiconductor material which is opaque to the light emitted from the active layer, or are formed from a semiconductor material having a smaller bandgap energy than that of the active layer.

6. The epitaxial wafer according to claim 5, wherein the intermediate layer includes $Ga_zIn_{1-z}P(0.6 \leq z \leq 0.9)$.

7. A light-emitting element, comprising:
   the epitaxial wafer defined in claim 1;
   a front surface electrode provided on the second current dispersing layer; and
   a back surface electrode provided on an opposite side of the reflective portion in relation to the semiconductor substrate.

8. The light-emitting element according to claim 7, comprising:
   a light-extracting layer on a surface of the second current dispersing layer in a region excluding the front surface electrode,
   wherein a material composing the light-extracting layer is transparent to a light emitted from the active layer and has a refractive index between that of semiconductor composing the second current dispersing layer and that of air.

9. The light-emitting element according to claim 8, wherein
   the light-extracting layer has a thickness of d within ±30% of a value defined by $A \times \lambda_p/(4 \times n)$, wherein $\lambda_p$ is a wavelength of a light emitted from the active layer, n is a refractive index of the light-extracting layer and A is a constant (A is an odd number).

10. A method of fabricating an epitaxial wafer comprising:
    growing a reflective portion, formed on a semiconductor substrate, including plural pairs of layers having a first semiconductor layer and a second semiconductor layer different from the first semiconductor layer;

growing a light-emitting portion, formed on the reflective portion, including an active layer provided between a first cladding layer of a first conductivity type and a second cladding layer of a second conductivity type which is different from the first conductivity type;

growing a current dispersion layer, formed on the light-emitting portion, including first and second current dispersing layers which have different carrier densities or impurity densities each other; and forming a convexoconcave portion on a surface of the second current dispersing layer, wherein the first semiconductor layer has a thickness of $T_A$ defined by Equation (1), $$T_A = \frac{\lambda_p}{4n_A\sqrt{1-\left(\frac{n_{In}\sin\theta}{n_A}\right)^2}} \quad (1)$$

wherein $\lambda_p$ is a peak wavelength of a light emitted from the active layer, $n_A$ is a refractive index of the first semiconductor layer, $n_B$ is a refractive index of the second semiconductor layer, $n_{In}$ is a refractive index of the first cladding layer and $\theta$ is an incident angle of a light to the second semiconductor layer;

wherein the second semiconductor layer has a thickness of $T_B$ defined by Equation (2), $$T_B = \frac{\lambda_p}{4n_B\sqrt{1-\left(\frac{n_{In}\sin\theta}{n_B}\right)^2}} \quad (2)$$

wherein the second current dispersing layer has a higher carrier density than that of the first semiconductor layer or a higher impurity density than that of the first semiconductor layer and is provided with the convexoconcave portion on the surface.

11. A method of fabricating a light-emitting element comprising:

growing a reflective portion comprising plural pair of layers, formed on a semiconductor substrate, including a first semiconductor layer and a second semiconductor layer different from the first semiconductor layer;

growing a light-emitting portion, formed on the reflective portion, including an active layer provided between a first cladding layer of a first conductivity type and a second cladding layer of a second conductivity type which is different from the first conductivity type;

growing a current dispersion layer, formed on the light-emitting portion, including a first and second current dispersing layers which have different carrier densities or impurity densities each other;

forming a convexoconcave portion on a surface of the second current dispersing layer;

forming plural front surface electrodes on a surface of the second current dispersing layer after the forming step of the convexoconcave portion, and cutting each region among the plural front surface electrodes, wherein the first semiconductor layer has a thickness of $T_A$ defined by Equation (1), $$T_A = \frac{\lambda_p}{4n_A\sqrt{1-\left(\frac{n_{In}\sin\theta}{n_A}\right)^2}} \quad (1)$$

wherein $\lambda_p$ is a peak wavelength of a light emitted from the active layer, $n_A$ is a refractive index of the first semiconductor layer, $n_B$ is a refractive index of the second semiconductor layer, $n_{In}$ is a refractive index of the first cladding layer and $\theta$ is an incident angle of a light to the second semiconductor layer, wherein the second semiconductor layer has a thickness of $T_B$ defined by Equation (2), $$T_B = \frac{\lambda_p}{4n_B\sqrt{1-\left(\frac{n_{In}\sin\theta}{n_B}\right)^2}} \quad (2)$$

wherein the second current dispersing layer has a higher carrier density than that of the first semiconductor layer or higher impurity density than that of the first semiconductor layer and is provided with the convexoconcave portion on the surface.

* * * * *